(12) United States Patent
Lue

(10) Patent No.: US 11,476,273 B2
(45) Date of Patent: Oct. 18, 2022

(54) THREE-DIMENSIONAL FLASH MEMORY DEVICE

(71) Applicant: MACRONIX International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 180 days.

(21) Appl. No.: 16/924,001

(22) Filed: Jul. 8, 2020

(65) Prior Publication Data
US 2022/0013535 A1   Jan. 13, 2022

(51) Int. Cl.
| | |
|---|---|
| *H01L 27/11582* | (2017.01) |
| *H01L 27/11524* | (2017.01) |
| *H01L 27/11556* | (2017.01) |
| *H01L 27/11519* | (2017.01) |
| *H01L 27/1157* | (2017.01) |
| *H01L 27/11565* | (2017.01) |
| *H01L 29/417* | (2006.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/41741* (2013.01)

(58) Field of Classification Search
CPC .................. H01L 27/11524; H01L 29/7926
See application file for complete search history.

(56) References Cited

U.S. PATENT DOCUMENTS

| | | | |
|---|---|---|---|
| 9,748,264 B1 * | 8/2017 | Jiang | H01L 21/76224 |
| 9,837,435 B1 | 12/2017 | Chang et al. | |
| 2015/0318301 A1 | 11/2015 | Lee et al. | |
| 2017/0148517 A1 | 5/2017 | Harari | |
| 2020/0203363 A1 | 6/2020 | Lue | |
| 2021/0375919 A1 * | 12/2021 | Wang | H01L 27/11582 |

FOREIGN PATENT DOCUMENTS

TW        201828456        8/2018

OTHER PUBLICATIONS

"Office Action of Taiwan Counterpart Application", dated Dec. 30, 2020, with English translation thereof, pp. 1-12.

* cited by examiner

*Primary Examiner* — John A Bodnar
(74) *Attorney, Agent, or Firm* — J.C. Patents

(57) ABSTRACT

Provided are various three-dimensional flash memory devices. A three-dimensional flash memory device includes a gate stacked structure, separate arc-shaped channel pillars, source/drain pillars and a charge storage structure. The gate stacked structure is disposed on a substrate and includes a plurality of gate layers electrically insulated from each other. The arc-shaped channel pillar are disposed on the substrate and located in the gate stacked structure. The source/drain pillars are disposed on the substrate and penetrate through the gate stacked structure, wherein two source/drain pillars are disposed at two ends of each of the arc-shaped channel pillars. The charge storage structure is disposed between each of the plurality of gate layers and the corresponding arc-shaped channel pillar.

20 Claims, 24 Drawing Sheets

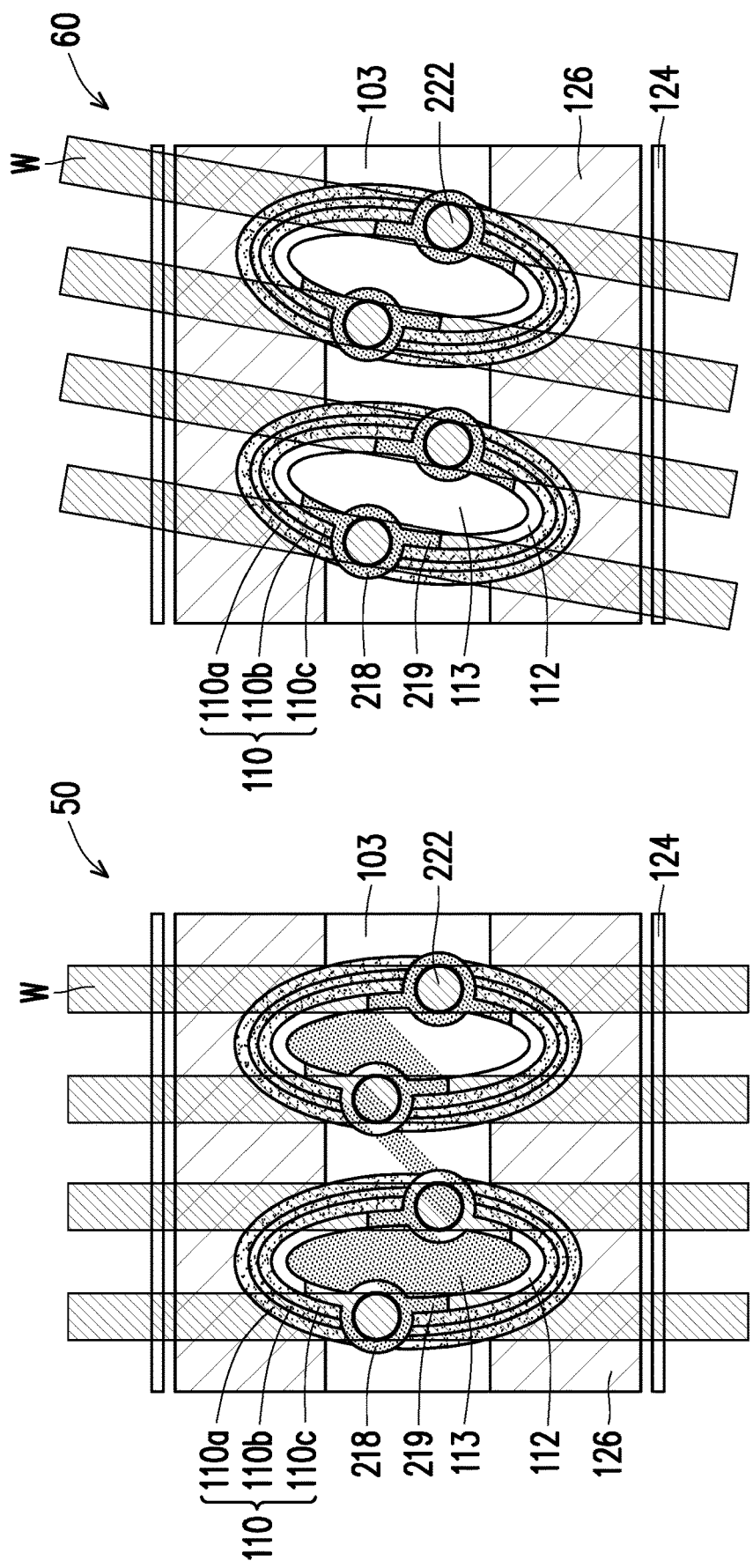

THREE-DIMENSIONAL FLASH MEMORY DEVICE

BACKGROUND OF THE INVENTION

1. Field of the Invention

The invention is related to a semiconductor device, and more generally to a three-dimensional flash memory device.

2. Description of Related Art

A non-volatile memory (such as a flash memory) is widely used in personal computers and other electronic devices because it has an advantage that the stored data does not disappear after being powered off.

The three-dimensional flash memory currently used in the industry includes a NOR flash memory and a NAND type flash memory. In addition, another type of three-dimensional flash memory is an AND type flash memory, which can be applied to a multi-dimensional flash memory array with high integration and high area utilization, and has an advantage of fast operation speed. Therefore, the development of a three-dimensional flash memory has gradually become the current trend.

SUMMARY OF THE INVENTION

The present invention provides a three-dimensional flash memory device, in which the channel pillars of memory cells are designed having an arc or semi-circular shape, so as to provide a longer channel length and an improved device performance.

The present invention provides a three-dimensional flash memory device that includes a gate stacked structure, separate arc-shaped channel pillars, source/drain pillars and a charge storage structure. The gate stacked structure is disposed on a substrate and includes a plurality of gate layers electrically insulated from each other. The arc-shaped channel pillar are disposed on the substrate and penetrate through the gate stacked structure. The source/drain pillars are disposed on the substrate and penetrate through the gate stacked structure, wherein two source/drain pillars are disposed at two ends of each of the arc-shaped channel pillars. The charge storage structure is disposed between each of the plurality of gate layers and the corresponding arc-shaped channel pillar.

According to an embodiment of the present invention, two adjacent arc-shaped channel pillars are in a mirror symmetrical configuration.

According to an embodiment of the present invention, two adjacent arc-shaped channel pillars are in a non-mirror symmetrical configuration.

According to an embodiment of the present invention, an insulating pillar is disposed between two adjacent arc-shaped channel pillars.

According to an embodiment of the present invention, the insulating pillars of different rows are in a staggered arrangement.

According to an embodiment of the present invention, the insulating pillar of different rows are in an aligned arrangement.

According to an embodiment of the present invention, the source/drain pillars at the corresponding ends of two adjacent arc-shaped channel pillars are separated from each other.

According to an embodiment of the present invention, a contact plug is electrically connected to the source/drain pillars at the corresponding ends of the two adjacent arc-shaped channel pillars.

According to an embodiment of the present invention, the contact plug is electrically connected to a conductive wire over the gate stacked structure.

According to an embodiment of the present invention, wherein the conductive wire includes a source line or a bit line.

According to an embodiment of the present invention, the source/drain pillars at the corresponding ends of two adjacent arc-shaped channel pillars in a mirror symmetrical configuration are connected to each other.

According to an embodiment of the present invention, a contact plug is electrically connected to the connected source/drain pillars.

According to an embodiment of the present invention, a sidewall of each of the charge storage structures has a substantially smooth profile.

According to an embodiment of the present invention, a sidewall of each of the charge storage structures has a wavy profile.

According to an embodiment of the present invention, each of the plurality of arc-shaped channel pillars is continuous in an extension direction thereof.

According to an embodiment of the present invention, each of the plurality of arc-shaped channel pillars is discontinuous in an extension direction thereof, and channel portions of the arc-shaped channel pillar merely correspond to the gate electrode layers.

According to an embodiment of the present invention, distances from two ends of each of the plurality of arc-shaped channel pillars to the corresponding gate electrode layer are constant.

According to an embodiment of the present invention, distances from two ends of each of the plurality of arc-shaped channel pillars to the corresponding gate electrode layer are non-constant.

According to an embodiment of the present invention, the plurality of arc-shaped channel pillars includes undoped polysilicon, and the plurality of source/drain pillars includes doped polysilicon.

According to an embodiment of the present invention, from a top view, each of the plurality of source/drain pillars is an L-shape, an I-shape, a polygonal shape, an arc shape, an annular shape or a combination thereof.

In view of the above, in the three-dimensional flash memory device of the present invention, the memory cells have arc-shaped channel pillars, so as to generate the curvature effect to enhance the operation window of programming/erasing the memory cells, and therefore provide a longer channel length and an improved device performance. Moreover, the three-dimensional flash memory device of the present invention has high integration and high area utilization, and meets the requirement of fast operation speed.

To make the features and advantages of the invention clear and easy to understand, the following gives a detailed description of embodiments with reference to accompanying drawings.

BRIEF DESCRIPTION OF THE DRAWINGS

FIG. 1A to FIG. 1I illustrate a manufacturing process of a three-dimensional flash memory device according to a first embodiment of the present invention, wherein FIG. 1A to FIG. 1F are schematic perspective views, and FIG. 1G to FIG. 1I are schematic top views.

FIG. 5 is a schematic top view of a three-dimensional flash memory according to a fifth embodiment of the present invention.

FIG. 6 is a schematic top view of a three-dimensional flash memory according to a sixth embodiment of the present invention.

DESCRIPTION OF THE EMBODIMENTS

Figure 1A:
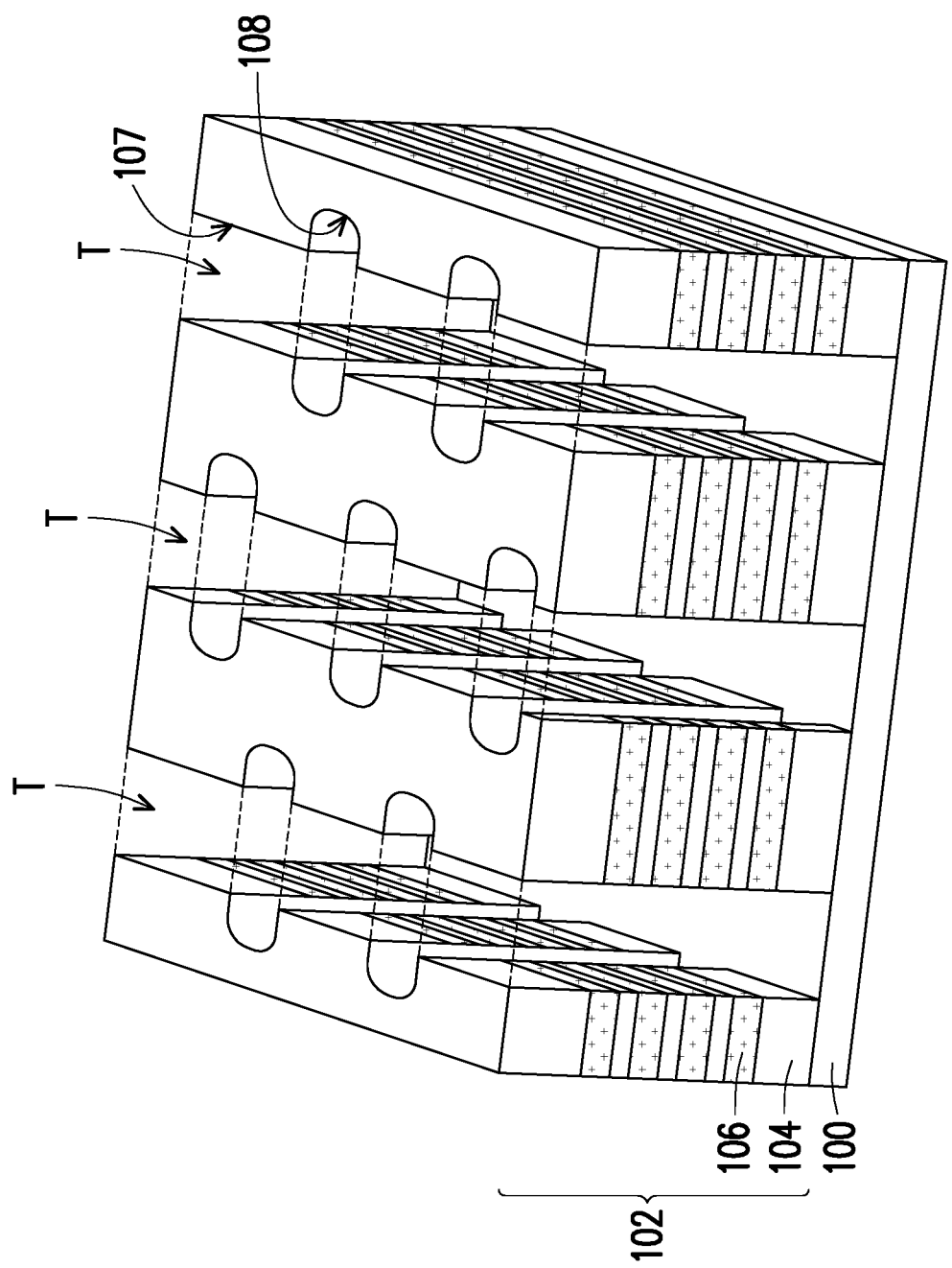
Figure 1B:
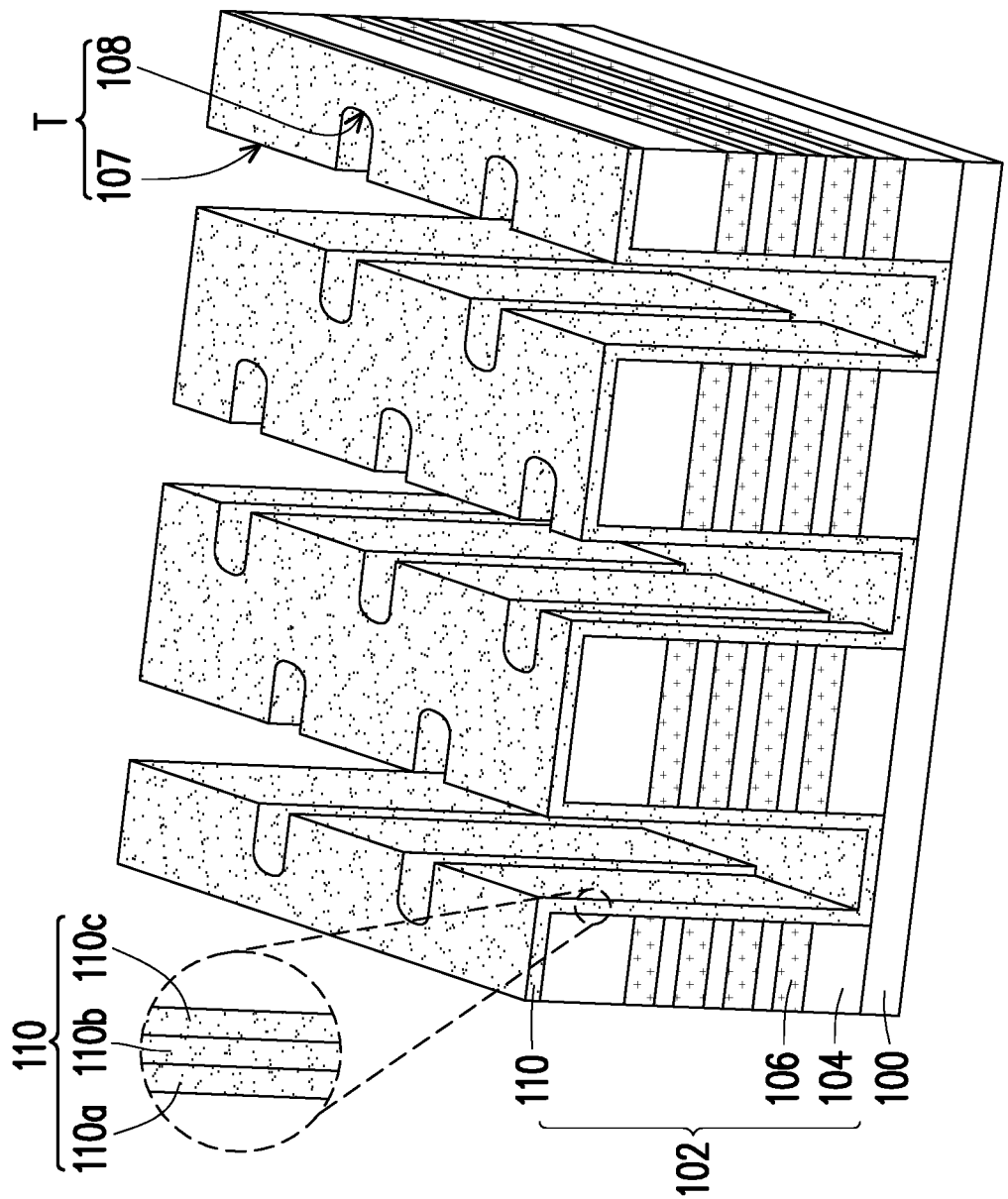
Figure 1C:
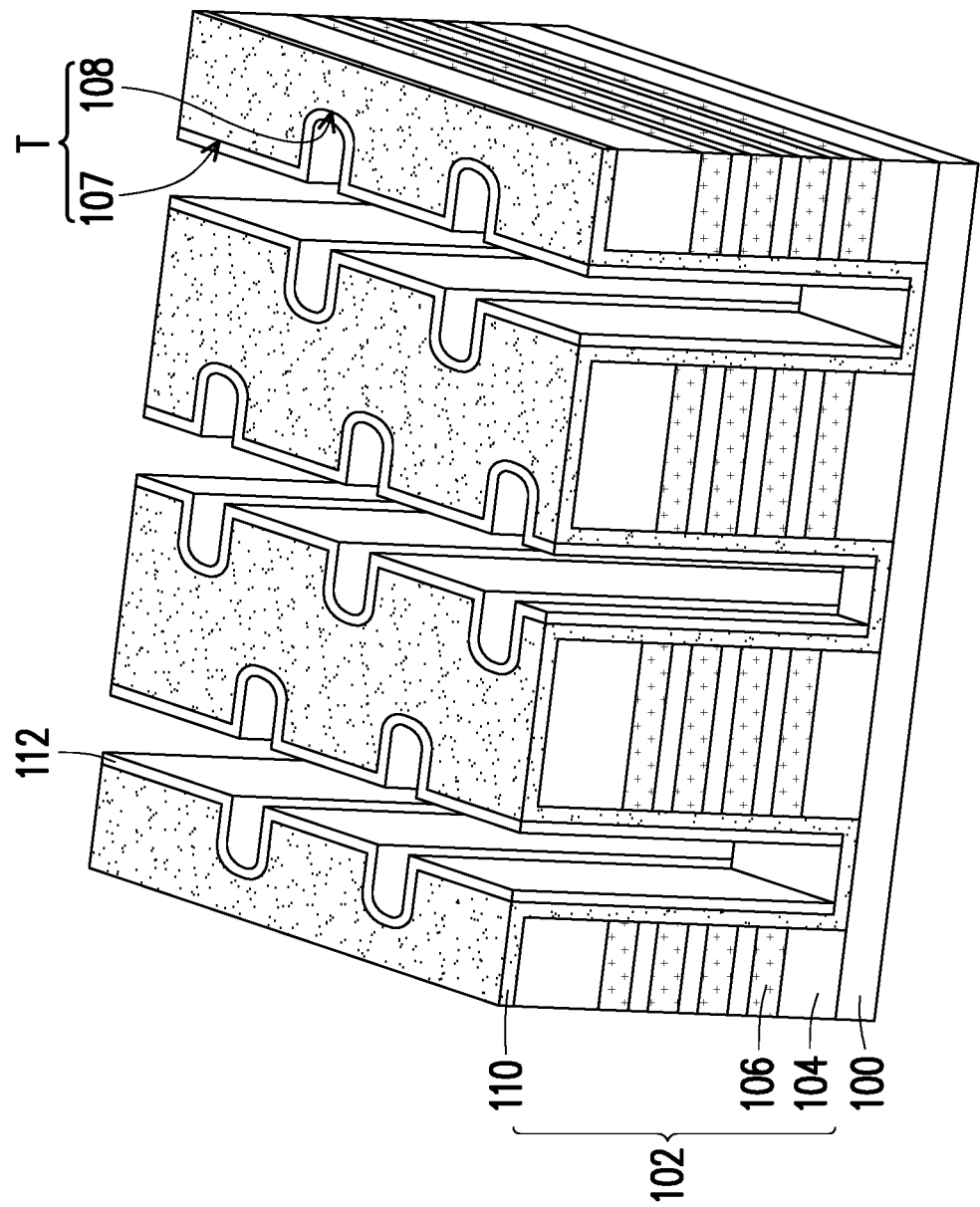
Figure 1D:
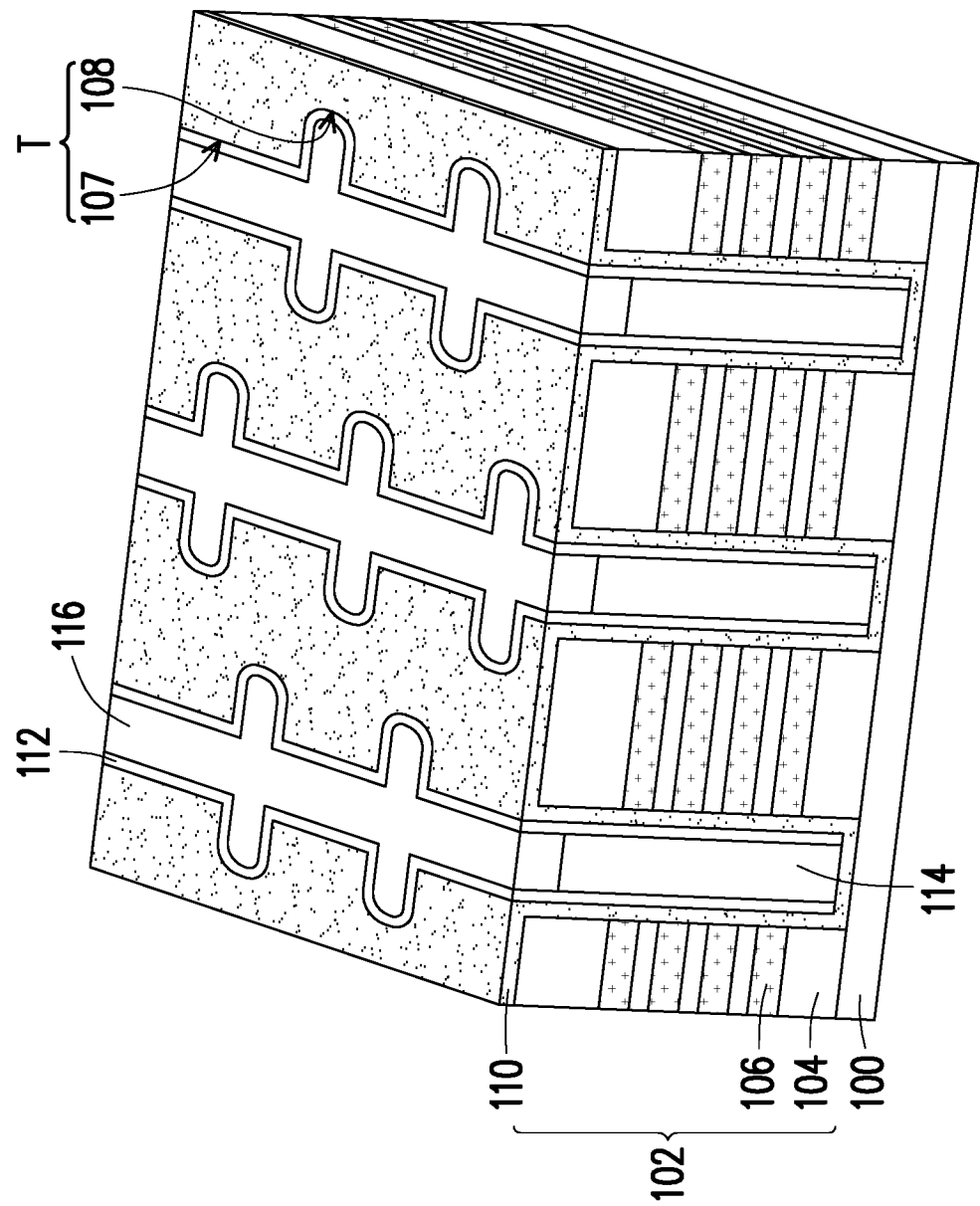
Figure 1E:
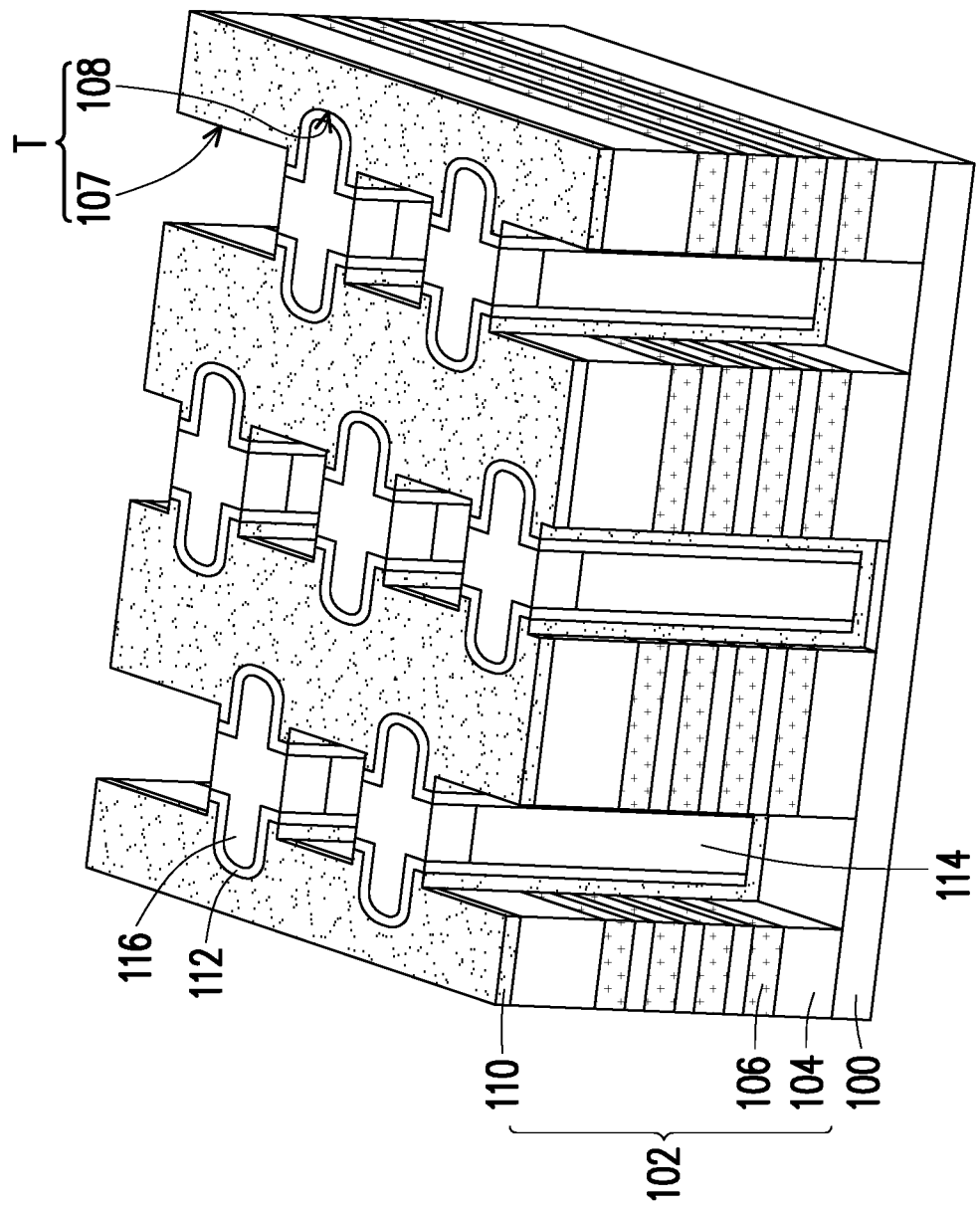
Figure 1F:
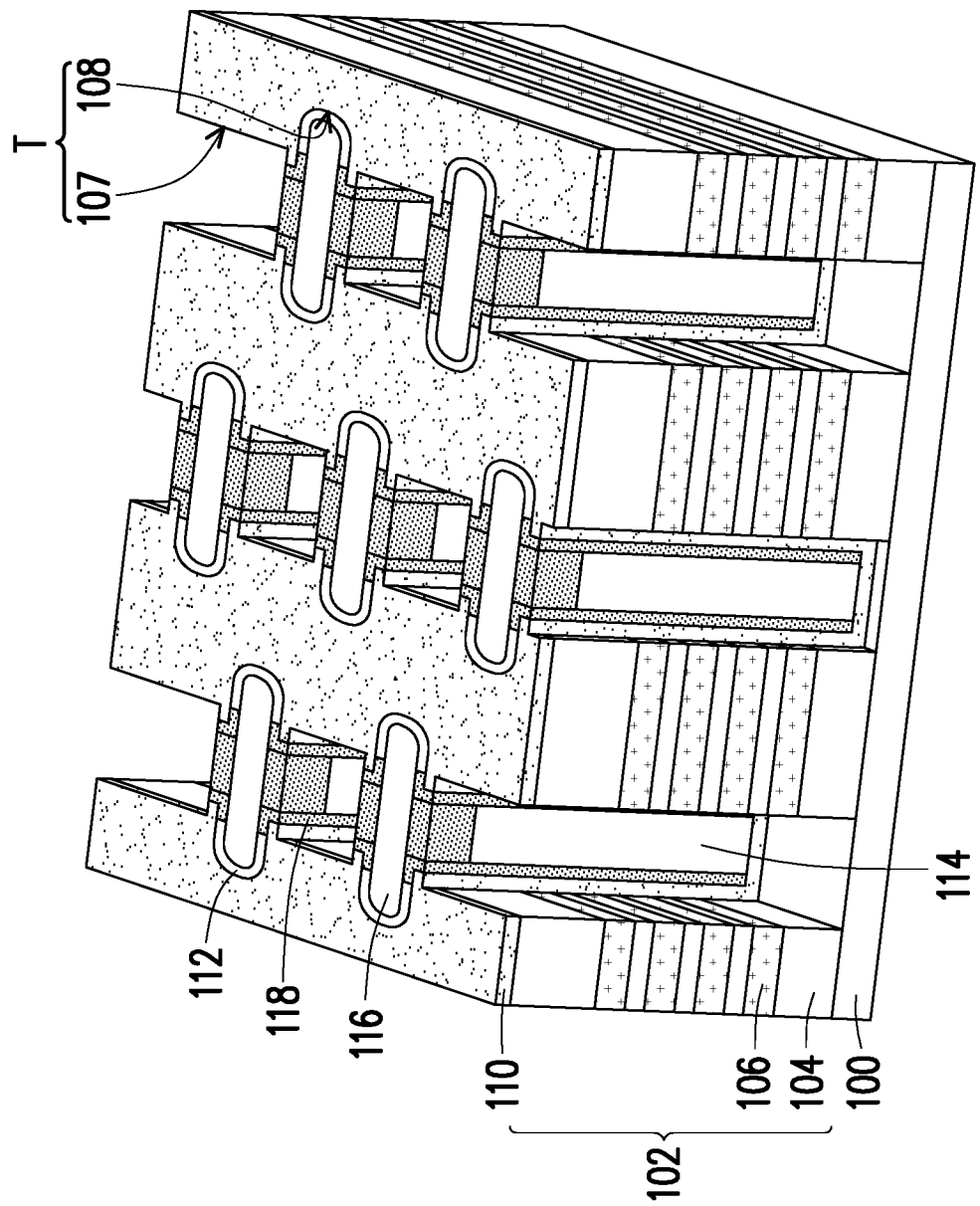
Figure 1G:
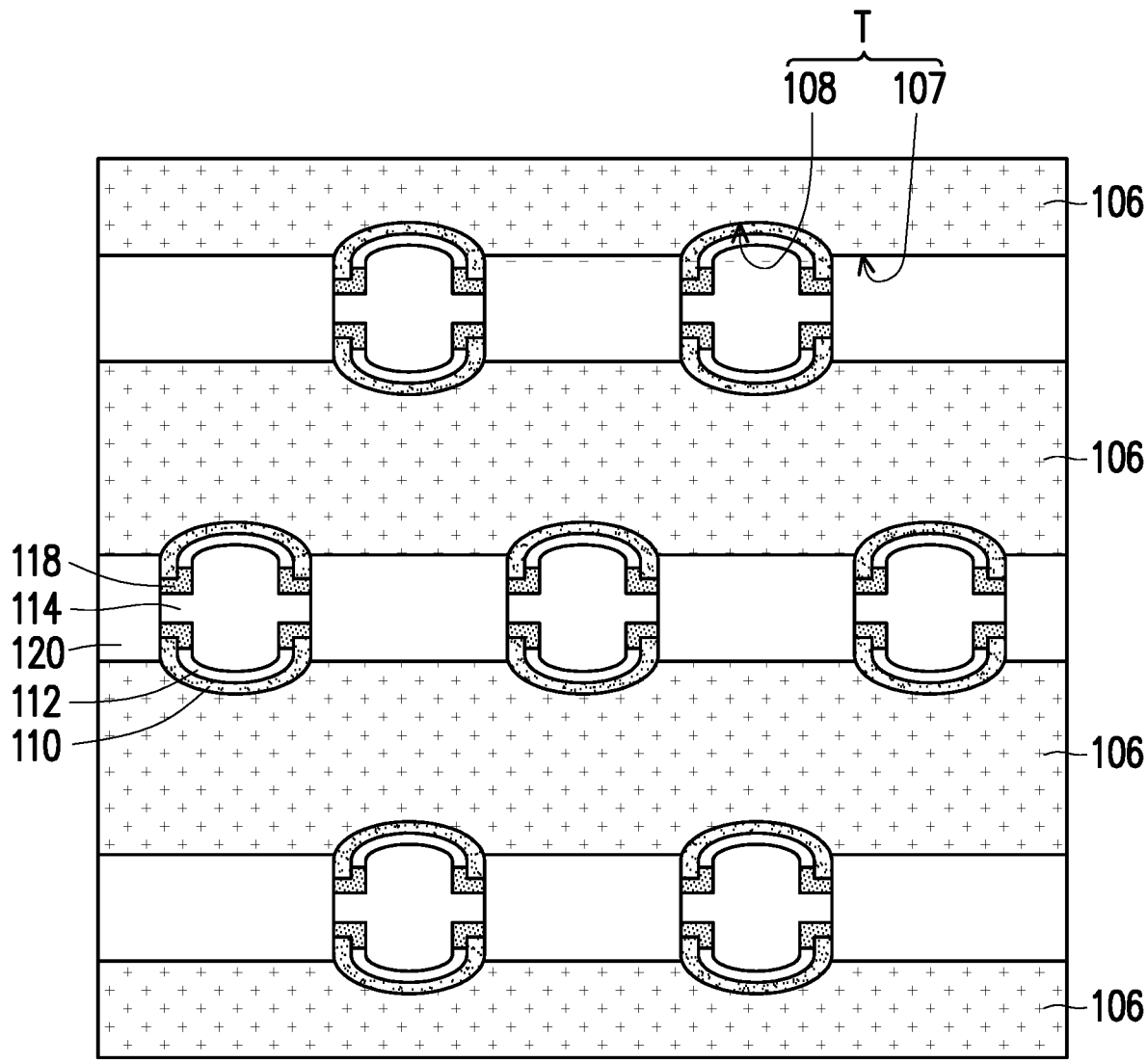
Figure 1H:
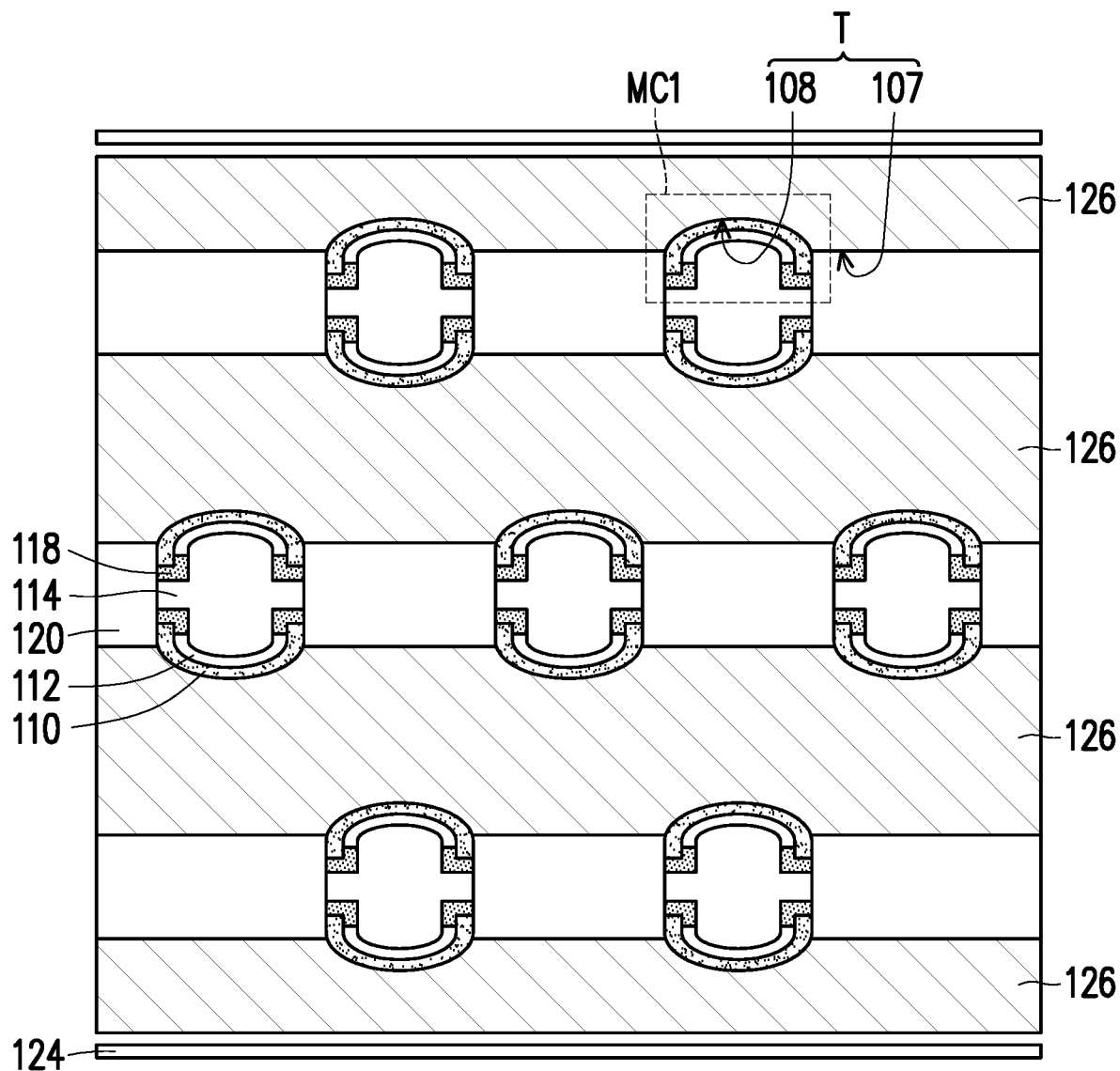
Figure 1I:
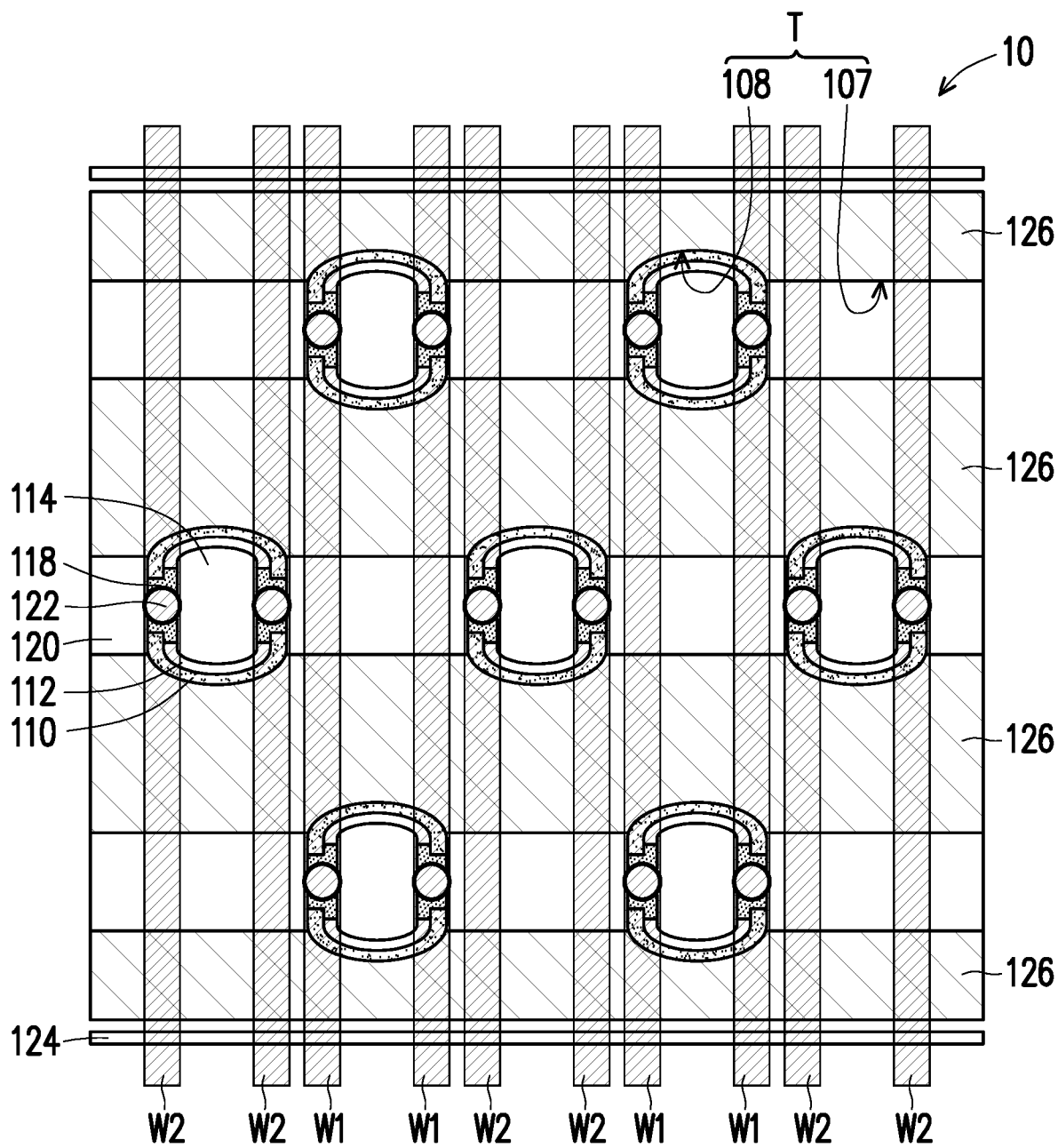

FIG. 1A to FIG. 1I illustrate a manufacturing process of a three-dimensional flash memory device according to a first embodiment of the present invention, wherein FIG. 1A to FIG. 1F are schematic perspective views, and FIG. 1G to FIG. 1I are schematic top views.

Referring to FIG. 1A, a stacked structure 102 is formed on a substrate 100. The substrate 100 may be a semiconductor substrate, such as a silicon-containing substrate. In an embodiment, doped regions may be formed in the substrate 100 upon the design requirements. In an embodiment, the substrate 100 has a dielectric layer (e.g., silicon oxide layer) formed thereon. In the present embodiment, the stacked structure 102 includes a plurality of first films 104 and a plurality of second films 106 stacked alternately on the substrate 100. In an embodiment, the first films 104 are insulating layers (e.g., silicon oxide layers), and the second films 106 are sacrificial layers (e.g., silicon nitride layers). However, the present invention is not limited thereto. In another embodiment, the first films 104 are insulating layers (e.g., silicon oxide layers), and the second films 106 are gate electrode layers (e.g., doped polysilicon layers).

Thereafter, a patterning process is performed, so as to form a plurality of trenches T penetrating through the stacked structure 102. In an embodiment, during the patterning process, a portion of the substrate 100 is simultaneously removed, so the trenches T extend into the substrate 100. In an embodiment, the trenches T have wavy sidewalls that are defined by a photomask. Specifically, the trenches T include a plurality of rectangular openings 107 and a plurality of cylindrical openings 108 arranged alternately. In an embodiment, the cylindrical openings 108 are configured for the subsequently formed memory cells, and the rectangular openings 107 are configured for an insulating layer for insulating adjacent memory cells from each other. In the present embodiment, from a top view, the cylindrical openings 108 have an elliptical shape, but the present invention is not limited thereto. In another embodiment, the cylindrical openings 108 may have another shape, such as a circle-like shape, a circular shape, an ellipse-like shape or a polygonal shape.

In an embodiment, the cylindrical openings 108 of the adjacent trenches T are staggered with one another. Specifically, the cylindrical openings 108 of the trenches T of the (N)-th row and the (N+2)-th row are aligned with each other, the cylindrical openings 108 of the trenches T of the (N+1)-th row and the (N+3)-th row are aligned with each other, and the cylindrical openings 108 of the trenches T of the (N)-th row and the (N+1)-th row are staggered with each other, wherein N is an integer. However, the present invention is not limited thereto. In another embodiment, the cylindrical openings 108 of the adjacent trenches T are aligned with one another.

Referring to FIG. 1B, a charge storage structure 110 is formed on the surfaces of the stacked structure 102 and the trenches T. In an embodiment, the charge storage structure 110 is an oxide-nitride-oxide (ONO) composite layer. For example, the charge storage structure 110 includes a silicon oxide layer 110a, a silicon nitride layer 110b and a silicon oxide layer 110c sequentially stacked on surfaces of the trenches T. In an embodiment, the charge storage structure 110 is blanket-formed on the sidewalls and bottoms of the trenches T. From another point of view, the charge storage structures 110 are formed respectively on the sidewalls and bottoms of the trenches T and are connected to each other. However, the present invention is not limited thereto. In another embodiment, the charge storage structures 110 are separated and formed in a spacer form on opposite sidewalls of each of the trenches T.

Referring to FIG. 1C, channel pillars 112 are formed on the charge storage structure 110 within the trenches T. Specifically, the channel pillars 112 are conformally formed along the sidewalls of the trenches T without filling up the trenches T. In an embodiment, the channel pillars 112 include undoped polysilicon. In an embodiment, two channel pillars 112 are formed in a spacer form on the opposite sidewalls of each trench T, and expose the charge storage structure 110 at the bottom of the trench T.

Referring to FIG. 1D, an insulating pillar 114 is filled in the lower portion of each of the trenches T. In an embodiment, the insulating pillar 114 includes silicon oxide. In an embodiment, the top of the insulating pillar 114 is lower the uppermost first film 104 and higher than the uppermost second film 106.

Thereafter, a conductive plug 116 is filled in the upper portion of each of the trenches T. In an embodiment, the conductive plug 116 includes undoped polysilicon. In an embodiment, the top of the conductive plug 116 is substantially coplanar with the top of the stacked structure 102.

Referring to FIG. 1E, the film layers in the rectangular openings 107 of the trenches T are removed, while the film layers in the cylindrical openings 108 of the trenches T remain. In an embodiment, photolithography and etching processes are performed, so as to remove the charge storage structure 110, the insulating pillar 114 and the conductive plug 116 in each of the rectangular openings of the trenches T. In an embodiment, after the removing step of FIG. 1E, the remaining channel pillars 112 have an arc-shape or a semi-circle shape, and the face-to-face channel pillars 112 are in a mirror symmetrical configuration.

In the present invention, the channel pillars 112 are referred to as arc-shaped channel pillars or semi-cylindrical channel layers, and the channel pillars 112 are continuous in an extension direction thereof (between the tops and bottoms of the cylindrical openings 108). Specifically, each of the channel pillars 112 is integral in the extension direction thereof and is not divided into a plurality of disconnected portions.

Referring to FIG. 1F, two source/drain pillars 118 are formed at two ends of each of the arc-shaped channel pillars 112. In the present invention, the source/drain pillars are referred to as buried diffusion regions. In an embodiment, a sidewall plasma doping process is performed, so as to implant the dopant into portions of the channel pillars 112 exposed by the rectangular openings 107, and therefore form source/drain pillars 118. In an embodiment, the sidewall plasma doping process also implants portions of the conductive plugs 114 exposed by the rectangular openings 107.

For the convenience of explanation, each of the following FIG. 1G to FIG. 1I only shows a schematic top view of the uppermost second film 106 in the stacked structure 102 to clearly understand the corresponding relationships between respective elements.

Referring to FIG. 1G, an isolation layer 120 is formed in the rectangular openings 107 of the trenches T. In an embodiment, the isolation layer 120 includes silicon oxide. In an embodiment, the top of the isolation layer 120 is substantially coplanar with the top of the stacked structure 102.

Referring to FIG. 1H, the second films 106 of the stacked structure 102 are replaced with gate electrode layers 126. In an embodiment, the second films 106 are removed from the stacked structure 102, so as to form horizontal openings between the first films 104. Thereafter, the gate electrode layers 126 are formed in the horizontal openings. The gate electrode layers 126 include tungsten (W), cobalt (Co), aluminum (Al), tungsten silicide ($WSi_x$), or cobalt silicide ($CoSi_x$). Moreover, in another embodiment, before the formation of the gate electrode layers 126, a buffer layer and a barrier layer are sequentially formed in each of the horizontal openings. The buffer layer includes a material having a dielectric constant greater than 7, such as aluminium oxide ($Al_2O_3$), hafnium oxide ($HfO_2$), lanthanum oxide ($La_2O_5$), transition metal oxide, lanthanide oxide, or a combination thereof. The barrier layer includes titanium (Ti), titanium nitride (TiN), tantalum (Ta), tantalum nitride (TaN), or a combination thereof.

In an embodiment, this replacement step is performed when the second films 106 are sacrificial layers (e.g., silicon nitride layers). After the replacement step, the stacked structure 102 can include the first films 104 (e.g., insulating layers) and the gate electrode layers 126 (e.g., tungsten layers) stacked alternately. In an embodiment, the stacked structure 102 is referred to as a gate stacked structure. However, the present invention is not limited thereto. In another embodiment, this replacement step may be omitted when the second films 106 are gate electrode layers (e.g., doped polysilicon layers). Memory cells MC1 of the present invention are thus completed.

In an embodiment, each of the memory cells MC1 includes a gate electrode layer 126 laterally disposed, an arc-shaped channel pillar 112 vertically disposed, a charge storage structure 110 disposed between a gate electrode layer 126 and the arc-shaped channel pillar 112, and two source/drain pillars 118 disposed at two ends of the arc-shaped channel pillar 112. In the present embodiment, the source/drain pillars 118 at the corresponding ends of two adjacent arc-shaped channel pillars 112 are separated from each other. In the present embodiment, the face-to-face memory cells MC1 are in a mirror symmetrical configuration, and can be operated separately or together upon the design requirements. The memory cells MC1 of the present invention have arc-shaped channel pillars, so as to generate the curvature effect to enhance the operation window of programing/erasing the memory cells, and therefore provide a longer channel length and an improved device performance.

In an embodiment, the three-dimensional flash memory device of the present invention may optionally include conductive layers 124 as heaters, so as to heat the gate stacked structure, as shown in FIG. 1H. In an embodiment, the conductive layers 124 are simultaneously formed in the above replacement step. The conductive layers 124 are disposed on the substrate 100 adjacent to the sidewalls of the gate stacked structure and extend along the sidewalls of the gate stacked structure. Moreover, in the present embodiment, the conductive layers 124 are disposed along two opposite sidewalls of the gate stacked structure, but the present invention is not limited thereto. In another embodiment, the conductive layers 124 may be provided only adjacent to one sidewall of the gate stacked structure according to the actual requirements, or the conductive layers 124 may be provided around the gate stacked structure. In the present embodiment, the method of using the conductive layer 124 as a heater is to apply a relatively high voltage and a relatively low voltage to the electrical connection points at two opposite end portions of the conductive layer 124 to form a voltage difference, respectively. In this way, a current can be generated. When the current passes through the conductive layer 124, the conductive layer 124 generates heat, which can heat the adjacent gate stacked structure.

Referring to FIG. 1I, multiple conductive wires W1 and W2 are formed on the stacked structure 102 and electrically connected to the memory cells MC1. Specifically, the conductive wires W1 are electrically connected to the memory cells MC1 of the (N)-th row and the (N+2)-th row, and the conductive wires W2 are electrically connected to the memory cells MC1 of the (N+1)-th row and the (N+3)-th row, wherein N is an integer. In an embodiment, each of the conductive wires W1 and W2 is a source line or a bit line upon the design requirements. In an embodiment, the conductive wires W1 and W2 are electrically connected to the memory cells MC1 through contact plugs 122, respectively. Specifically, a contact plug 122 is electrically connected to the source/drain pillars 118 at the corresponding ends of two adjacent arc-shaped channel pillars 112. In an embodiment, from a top view, the contact plug 122 is partially overlapped with the adjacent source/drain pillars 118. The three-dimensional flash memory device 10 of the present invention is thus completed.

FIG. 2A to FIG. 2F are schematic top views of a manufacturing process of a three-dimensional flash memory according to a second embodiment of the present invention. For the convenience of explanation, each of the following FIG. 2A to FIG. 2F only shows a schematic top view of the uppermost second film 106 in the stacked structure to clearly understand the corresponding relationships between respective elements. Moreover, in the second embodiment, elements that are similar in material or function to those in the first embodiment use similar reference numerals.

Figure 2A:
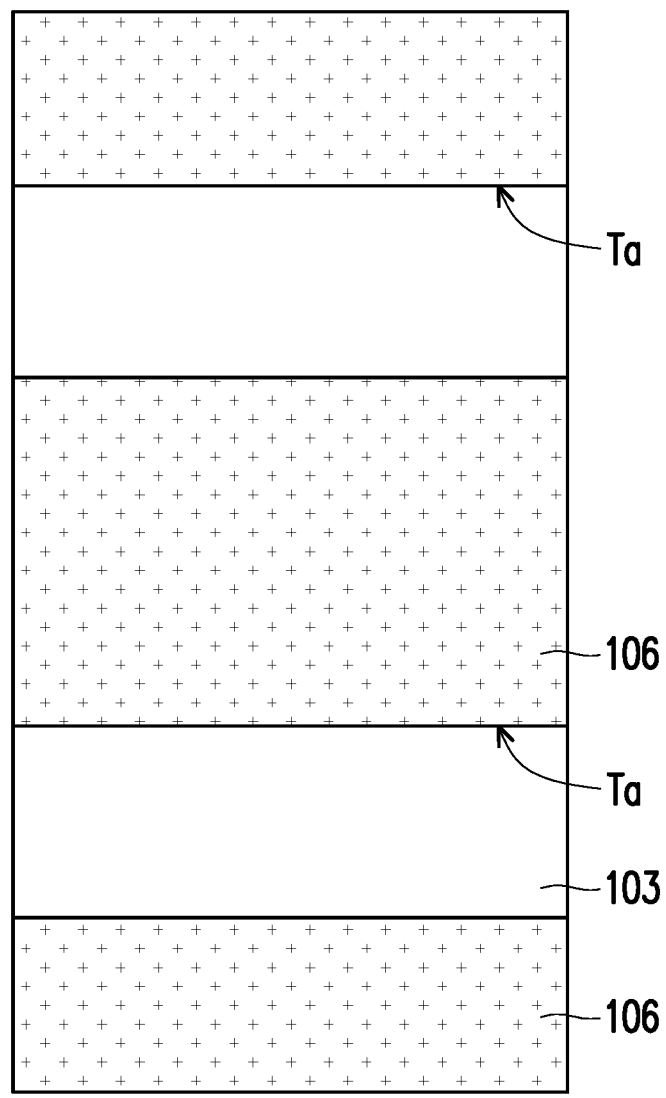
FIG. 2A to FIG. 2F are schematic top views of a manufacturing process of a three-dimensional flash memory according to a second embodiment of the present invention.

Referring to FIG. 2A, a stacked structure is formed on a substrate. In an embodiment, the stacked structure includes a plurality of first films and a plurality of second films 106 stacked alternately on the substrate. In an embodiment, the first films are insulating layers (e.g., silicon oxide layers), and the second films are sacrificial layers (e.g., silicon nitride layers). However, the present invention is not limited thereto. In another embodiment, the first films are insulating layers (e.g., silicon oxide layers), and the second films are gate electrode layers (e.g., doped polysilicon layers).

Thereafter, a patterning process is performed, so as to form a plurality of trenches Ta penetrating through the stacked structure. In an embodiment, during the patterning process, a portion of the substrate may be simultaneously removed, so the trenches Ta extend into the substrate. In an embodiment, the sidewalls of the trenches Ta are substantially vertical.

Afterwards, an isolation layer 103 is formed in the trenches Ta. In an embodiment, the isolation layer 103 includes silicon oxide. In an embodiment, the top of the isolation layer 103 is substantially coplanar with the top of the stacked structure.

Figure 2B:
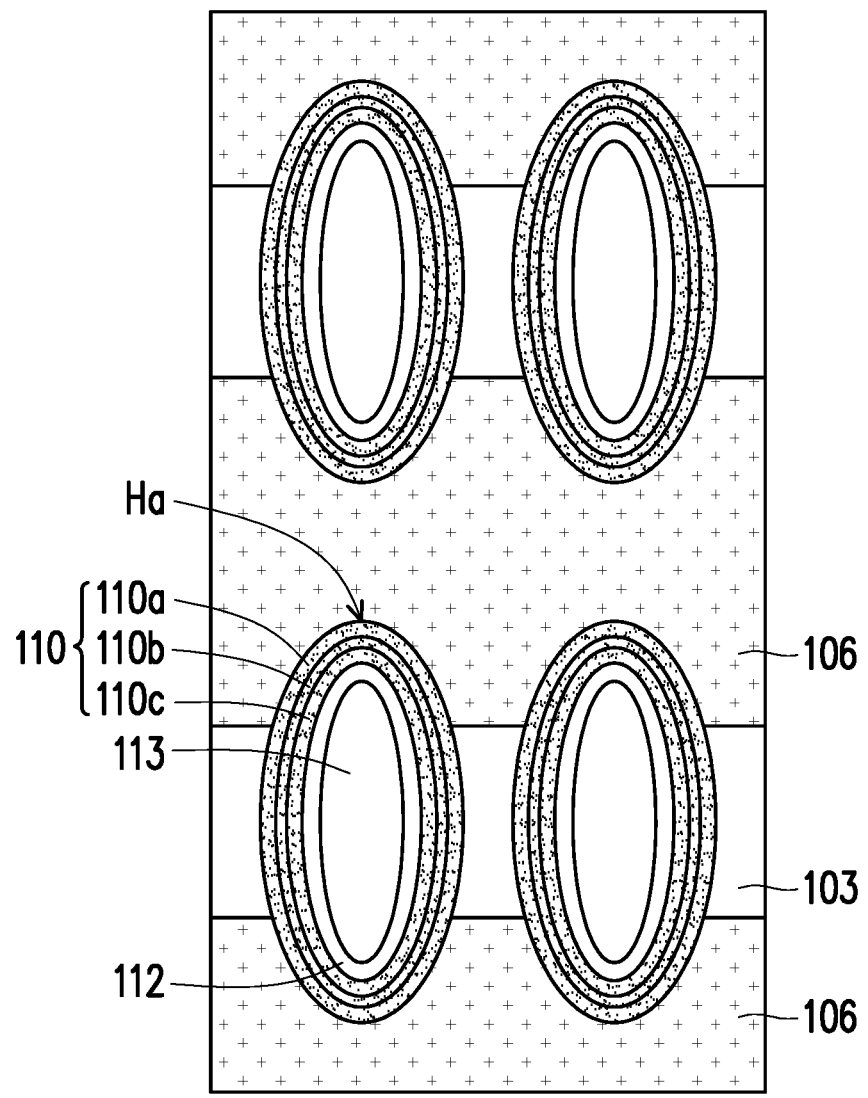

Referring to FIG. 2B, a patterning process is performed, so as to form a plurality of cylindrical openings Ha penetrating through the stacked structure and the isolation layer 103. In the present embodiment, from a top view, the cylindrical openings Ha have an elliptical shape, but the present invention is not limited thereto. In another embodiment, the cylindrical openings Ha may have another shape, such as a circular shape, an ellipse-like shape or a polygonal shape.

In an embodiment, the adjacent cylindrical openings Ha are aligned with each other. Specifically, the cylindrical openings Ha of the (N)-th row and the (N+1)-th row are aligned with each other, wherein N is an integer. However, the present invention is not limited thereto. In another embodiment, the adjacent cylindrical openings Ha are staggered with one another.

Thereafter, charge storage structures 110 are formed on the sidewalls of the cylindrical openings Ha. In the present embodiment, from a top view, each of the charge storage structures 110 has an annular shape. In an embodiment, each charge storage structure 110 is an oxide-nitride-oxide (ONO) composite layer. For example, each charge storage structure 110 includes a silicon oxide layer 110a, a silicon nitride layer 110b and a silicon oxide layer 110c sequentially stacked on the sidewall of the corresponding cylindrical opening Ha. In an embodiment, the charge storage structures 110 are formed on the sidewalls and bottoms of cylindrical openings Ha. However, the present invention is not limited thereto. In another embodiment, the charge storage structures 110 are merely formed on the sidewalls of the cylindrical openings Ha.

Afterwards, channel pillars 112 are formed on the charge storage structures 110 within the cylindrical openings Ha. In the present embodiment, from a top view, each of the channel pillars 112 has an annular shape. In an embodiment, the channel pillars 112 include undoped polysilicon. In an embodiment, a channel pillar 112 is merely formed on the sidewall of each cylindrical opening Ha, and exposes the charge storage structure 110 at the bottom of the cylindrical opening Ha.

Thereafter, insulating pillars 113 are filled in the cylindrical openings Ha. In an embodiment, the insulating pillars 113 include silicon oxide. In an embodiment, the tops of the insulating pillars 113 are substantially coplanar with the top of the stacked structure.

Figure 2C:
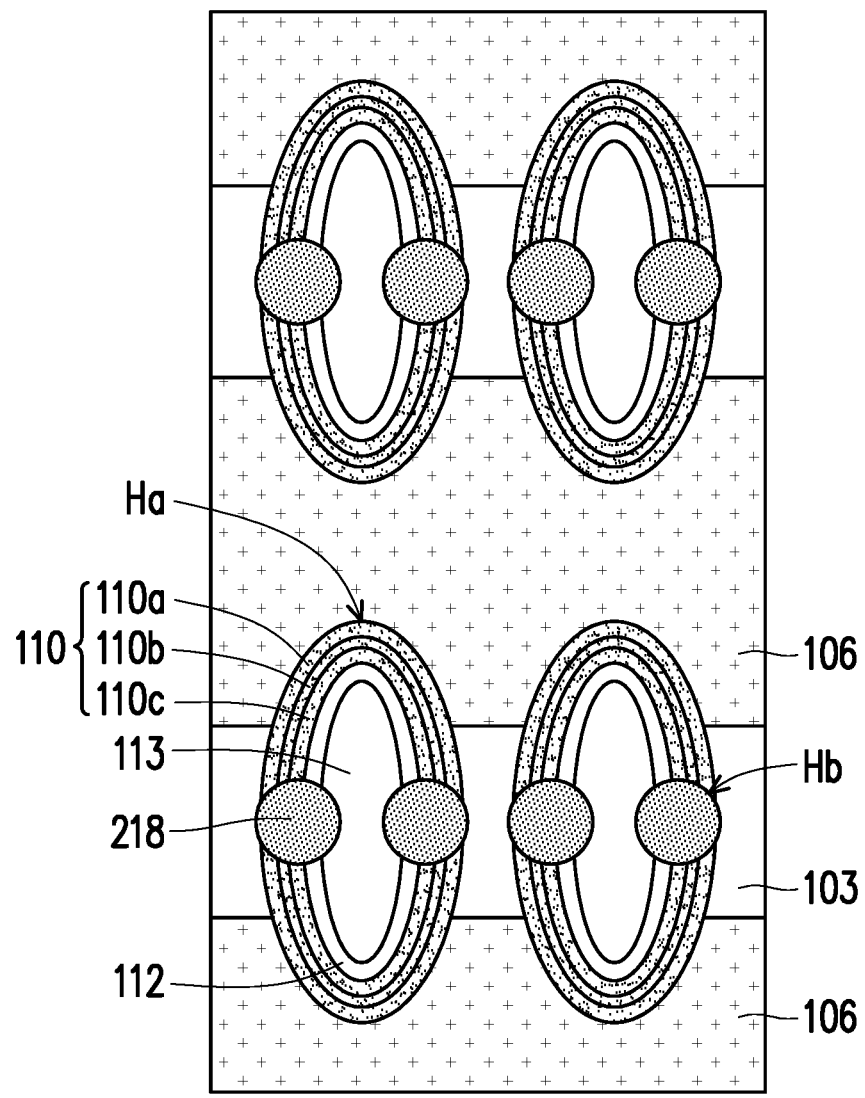

Referring to FIG. 2C, a patterning process is performed, so as to form a plurality of cylindrical openings Hb penetrating through the charge storage structures 110 and the channel pillars 112. In an embodiment, the patterning process also removes portions of the insulating pillars 113 and a portion of the isolation layer 103. In an embodiment, two cylindrical openings Hb are formed at two opposite sides of each of the annular channel pillars 112 and the corresponding annular charge storage structure 110. In the present embodiment, from a top view, the cylindrical openings Hb have a circular shape, but the present invention is not limited thereto. In another embodiment, the cylindrical openings Hb may have another shape, such as an elliptical shape, an ellipse-like shape or a polygonal shape.

Thereafter, source/drain pillars 218 are formed in the cylindrical openings Hb. In an embodiment, the source/drain pillars 218 include doped polysilicon.

Figure 2D:
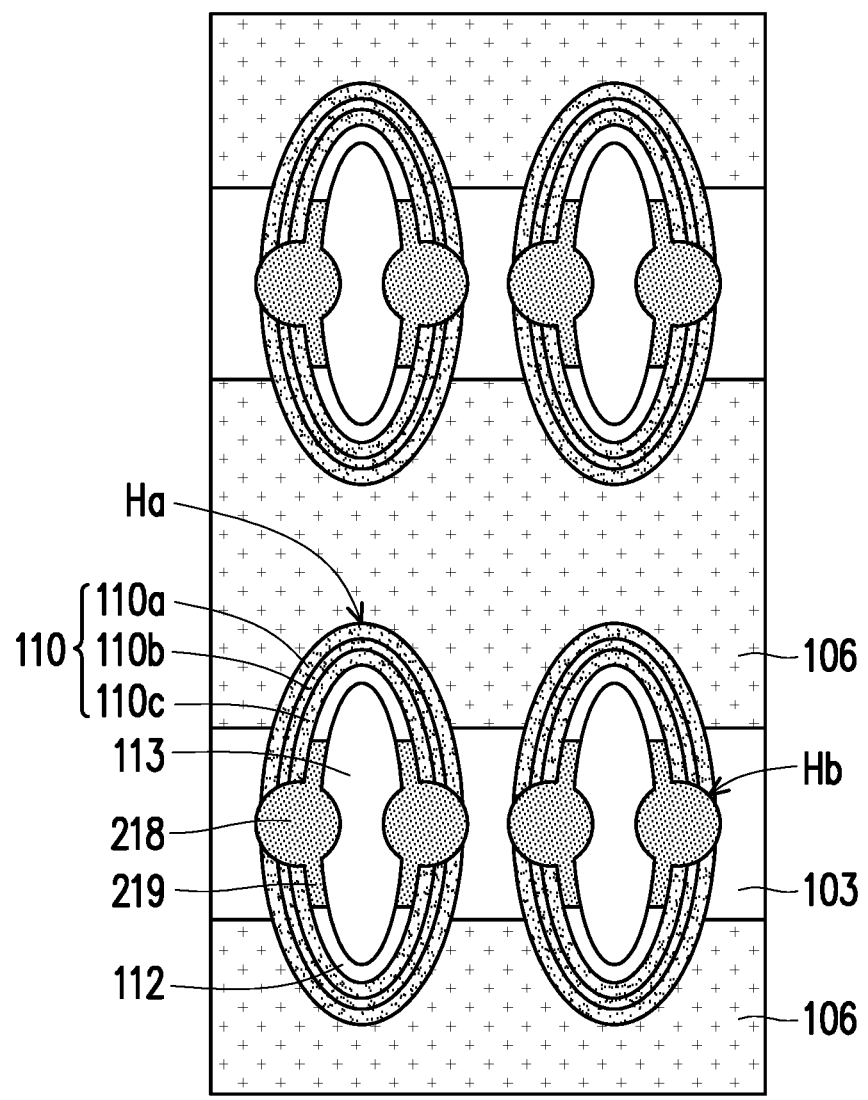

Referring to FIG. 2D, an annealing process is performed, so as to diffuse the dopant within the source/drain pillars 218 outwardly. In an embodiment, the dopant of each of the source/drain pillars 218 is diffused toward two sides along the corresponding annular channel pillar 112, so as to form the source/drain pillars 218 each having two extension portions 219.

Figure 2E:
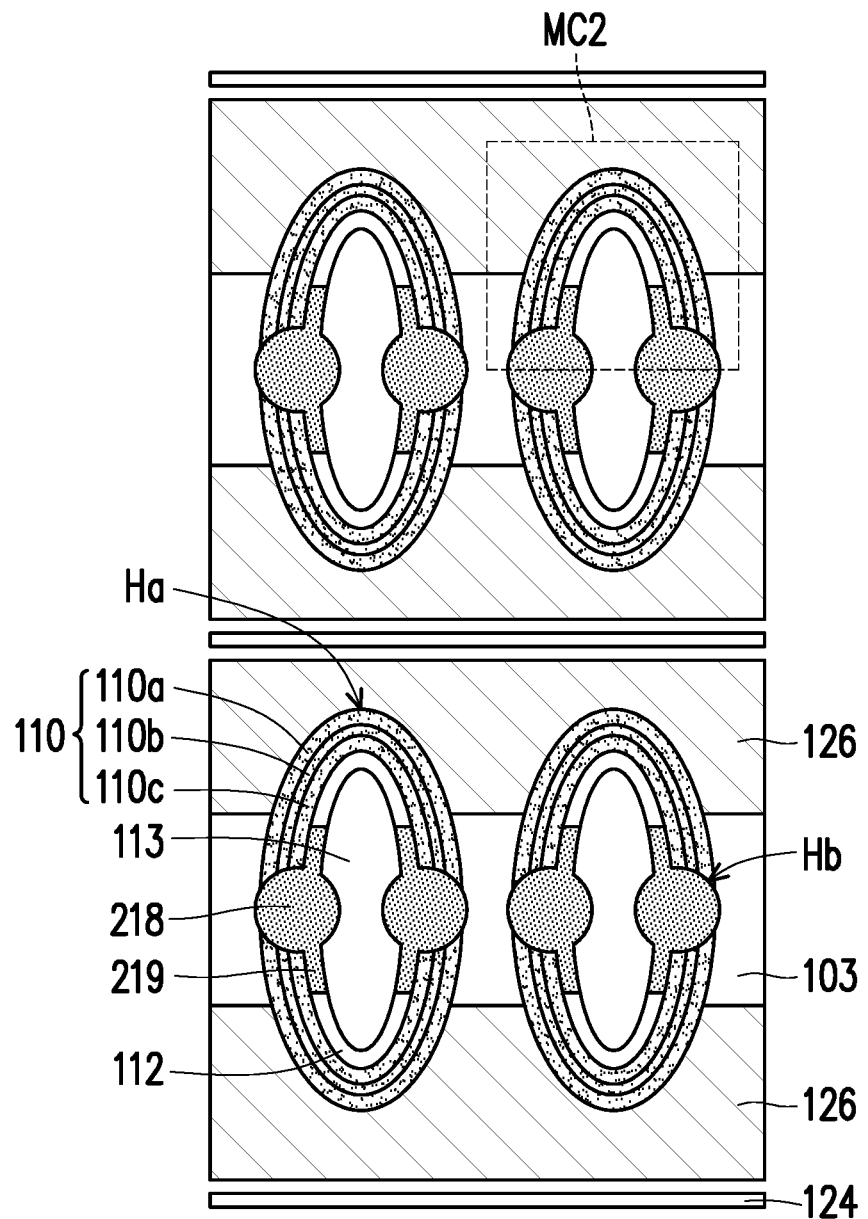

Referring to FIG. 2E, the second films 106 of the stacked structure are replaced with gate electrode layers 126. In an embodiment, the gate electrode layers 126 include tungsten (W), cobalt (Co), aluminum (Al), tungsten silicide (WSi$_x$), or cobalt silicide (CoSi$_x$). Moreover, in another embodiment, a buffer layer and a barrier layer are formed between each gate electrode layer 126 and the corresponding charge storage structure 110. The buffer layer includes a material having a dielectric constant greater than 7, such as aluminium oxide ($Al_2O_3$), hafnium oxide ($HfO_2$), lanthanum oxide ($La_2O_5$), transition metal oxide, lanthanide oxide, or a combination thereof. The barrier layer includes titanium (Ti), titanium nitride (TiN), tantalum (Ta), tantalum nitride (TaN), or a combination thereof.

In an embodiment, this replacement step is performed when the second films 106 are sacrificial layers (e.g., silicon nitride layers). However, the present invention is not limited thereto. In another embodiment, this replacement step may be omitted when the second films 106 are gate electrode layers (e.g., doped polysilicon layers). Memory cells MC2 of the present invention are thus completed.

In the present embodiment, each of the memory cells MC2 includes a gate electrode layer 126 laterally disposed, an arc-shaped channel pillar 112 vertically disposed, a charge storage structure 110 disposed between a gate electrode layer 126 and the arc-shaped channel pillar 112, and two source/drain pillars 218 disposed at two ends of the arc-shaped channel pillar 112. In the present embodiment, the source/drain pillars 118 at the corresponding ends of two adjacent arc-shaped channel pillars 112 are connected to each other. In the present embodiment, the face-to-face memory cells MC2 are in a mirror symmetrical configuration, and share the source/drain pillars 218. Such shared and larger-area source/drain pillars 218 are beneficial to reduce the resistance value, and provide a larger landing area for the subsequently formed contact plug. The memory cells MC2 of the present invention have arc-shaped channel pillars, so as to generate the curvature effect to enhance the operation window of programing/erasing the memory cells, and therefore provide a longer channel length and an improved device performance.

In an embodiment, the three-dimensional flash memory device of the present invention may optionally include conductive layers 124 as heaters, so as to heat the gate stacked structure, as shown in FIG. 2E. In an embodiment, the conductive layers 124 are simultaneously formed in the above replacement step. The conductive layers 124 are disposed on the substrate adjacent to the sidewalls of the gate stacked structure and extend along the sidewalls of the gate stacked structure.

Figure 2F:
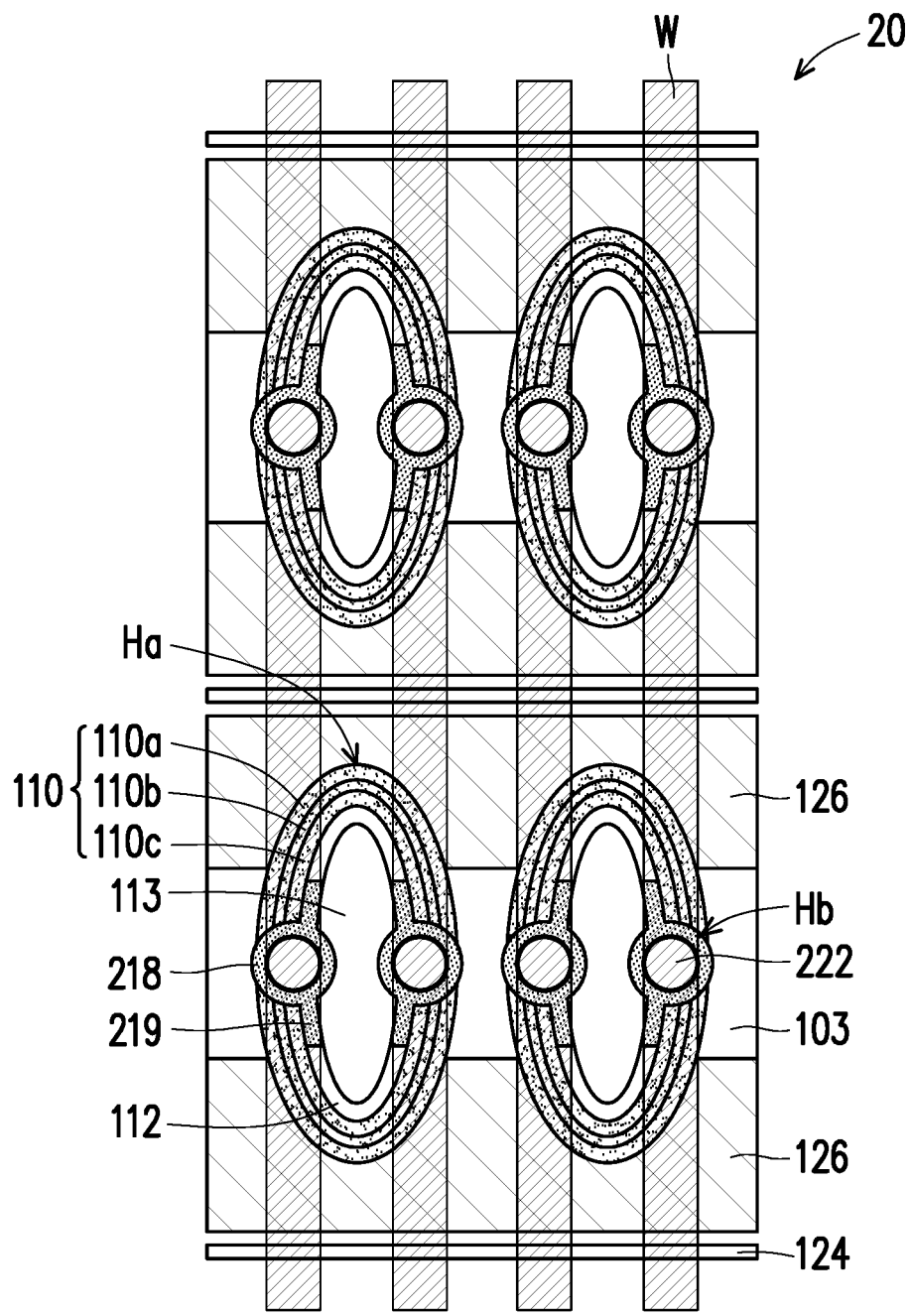

Referring to FIG. 2F, multiple conductive wires W are formed on the stacked structure 102 and electrically connected to the memory cells MC2. Specifically, the conductive wires W are electrically connected to the memory cells MC2 of the (N)-th row and the (N+1)-th row, wherein N is an integer. In an embodiment, each of the conductive wires W is a source line or a bit line upon the design requirements. In an embodiment, the conductive wires W are electrically connected to the memory cells MC2 through contact plugs 222, respectively. Specifically, a contact plug 222 is electrically connected to the source/drain pillars 218 at the corresponding ends of two adjacent arc-shaped channel pillars 112. In an embodiment, from a top view, the contact plug 222 is partially overlapped with the adjacent source/drain pillars 218. The three-dimensional flash memory device 20 of the present invention is thus completed.

FIG. 3A to FIG. 3F are schematic top views of a manufacturing process of a three-dimensional flash memory according to a third embodiment of the present invention. For the convenience of explanation, each of the following FIG. 3A to FIG. 3F only shows a schematic top view of the uppermost second film 106 in the stacked structure to clearly understand the corresponding relationships between respective elements. Moreover, in the third embodiment, elements that are similar in material or function to those in the first embodiment or the second embodiment use similar reference numerals.

Figure 3A:
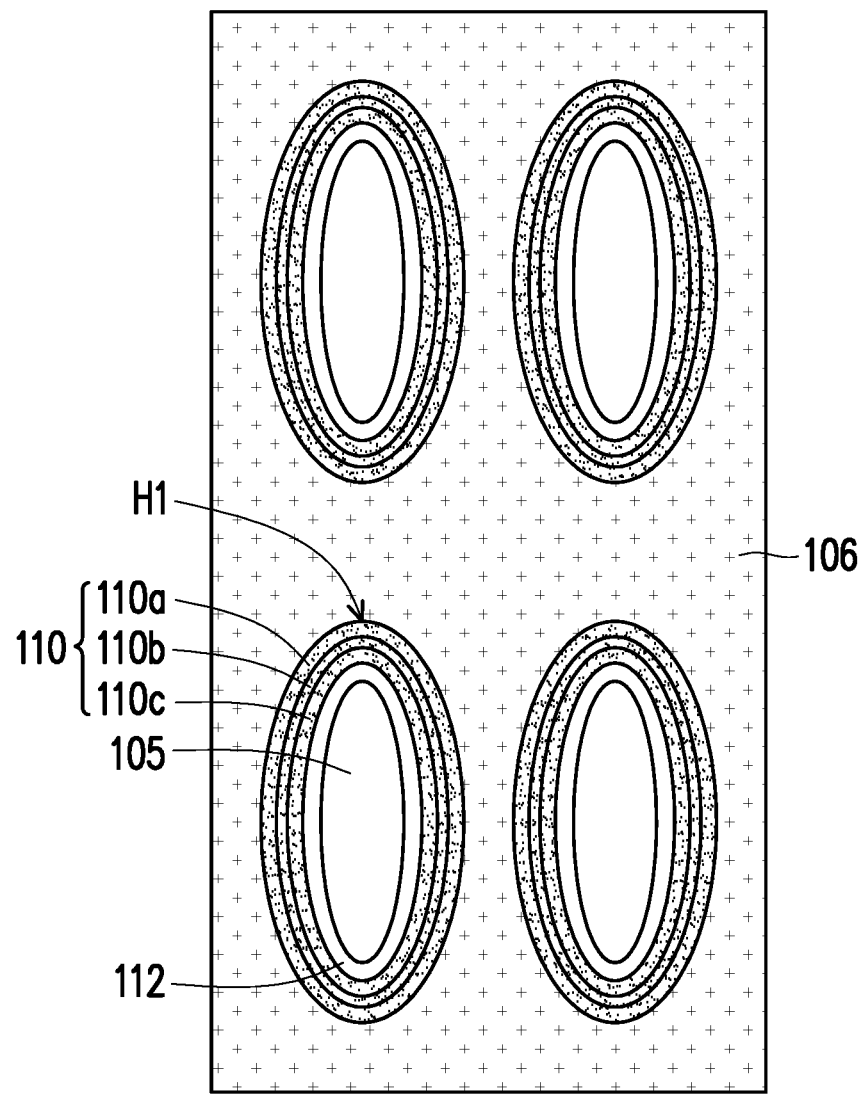
FIG. 3A to FIG. 3F are schematic top views of a manufacturing process of a three-dimensional flash memory according to a third embodiment of the present invention.

Referring to FIG. 3A, a stacked structure is formed on a substrate. In an embodiment, the stacked structure includes a plurality of first films and a plurality of second films 106 stacked alternately on the substrate. In an embodiment, the first films are insulating layers (e.g., silicon oxide layers), and the second films are sacrificial layers (e.g., silicon nitride layers). However, the present invention is not limited thereto. In another embodiment, the first films are insulating layers (e.g., silicon oxide layers), and the second films are gate electrode layers (e.g., doped polysilicon layers).

Thereafter, a patterning process is performed, so as to form a plurality of cylindrical openings H1 penetrating through the stacked structure. In the present embodiment, from a top view, the cylindrical openings H1 has an elliptical profile, but the present invention is not limited thereto. In another embodiment, the cylindrical openings H1 may have another shape, such as a circular shape, an ellipse-like shape or a polygonal shape. In an embodiment, the cylindrical openings H1 of the adjacent rows are aligned with each other. In another embodiment, the cylindrical openings H1 of the adjacent rows are staggered with each other.

Thereafter, charge storage structures 110 are formed on the sidewalls of the cylindrical openings H1. In the present embodiment, from a top view, each of the charge storage structures 110 has an annular shape. In an embodiment, each charge storage structure 110 is an oxide-nitride-oxide (ONO) composite layer. For example, each charge storage structure 110 includes a silicon oxide layer 110a, a silicon nitride layer 110b and a silicon oxide layer 110c sequentially stacked on the sidewall of the corresponding cylindrical opening H1. In an embodiment, the charge storage structures 110 are formed on the sidewalls and bottoms of cylindrical openings H1. However, the present invention is not limited thereto. In another embodiment, the charge storage structures 110 are merely formed on the sidewalls of the cylindrical openings H1.

Afterwards, channel pillars 112 are formed on the charge storage structures 110 within the cylindrical openings H1. In the present embodiment, from a top view, each of the channel pillars 112 has an annular shape. In an embodiment, the channel pillars 112 include undoped polysilicon. In an embodiment, a channel pillar 112 is merely formed on the sidewall of each cylindrical opening H1, and exposes the charge storage structure 110 at the bottom of the cylindrical opening H1.

Thereafter, insulating pillars 105 are filled in the cylindrical openings H1. In an embodiment, the insulating pillars 105 include silicon oxide. In an embodiment, the tops of the insulating pillars 105 are substantially coplanar with the top of the stacked structure.

Figure 3B:
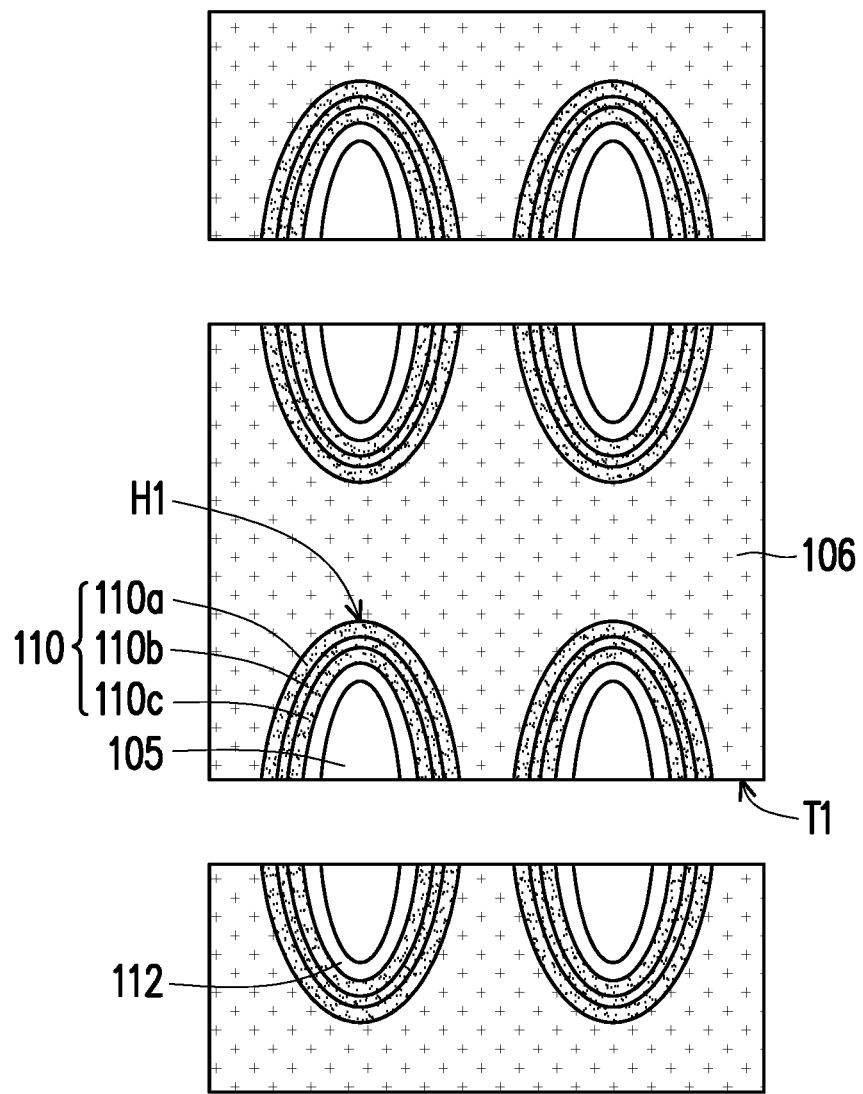

Referring to FIG. 3B, a patterning process is performed, so as to form a plurality of trenches T1 penetrating through the stacked structure, the charge storage structures 110, the channel pillars 112 and the insulating pillars 105. In an embodiment, during the patterning process, a portion of the substrate may be simultaneously removed, so the trenches T1 extend into the substrate. In an embodiment, the sidewalls of the trenches T1 are substantially vertical.

Figure 3C:
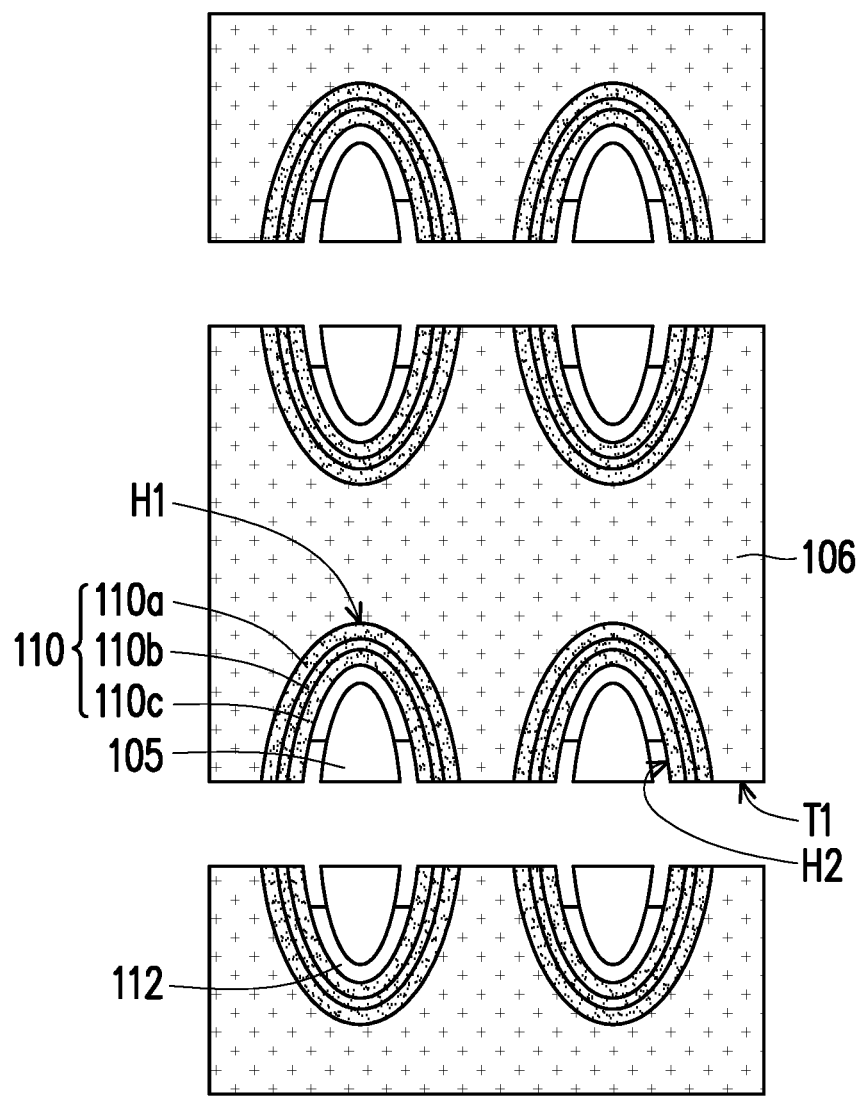

Referring to FIG. 3C, an etching process is performed, so as to remove portions of the channel pillars 112 exposed by the trenches T1, and therefore form openings H2 at the ends of the remaining channel pillars 112. In an embodiment, two openings H2 are disposed at two ends of each of the channel pillars 112.

Figure 3D:
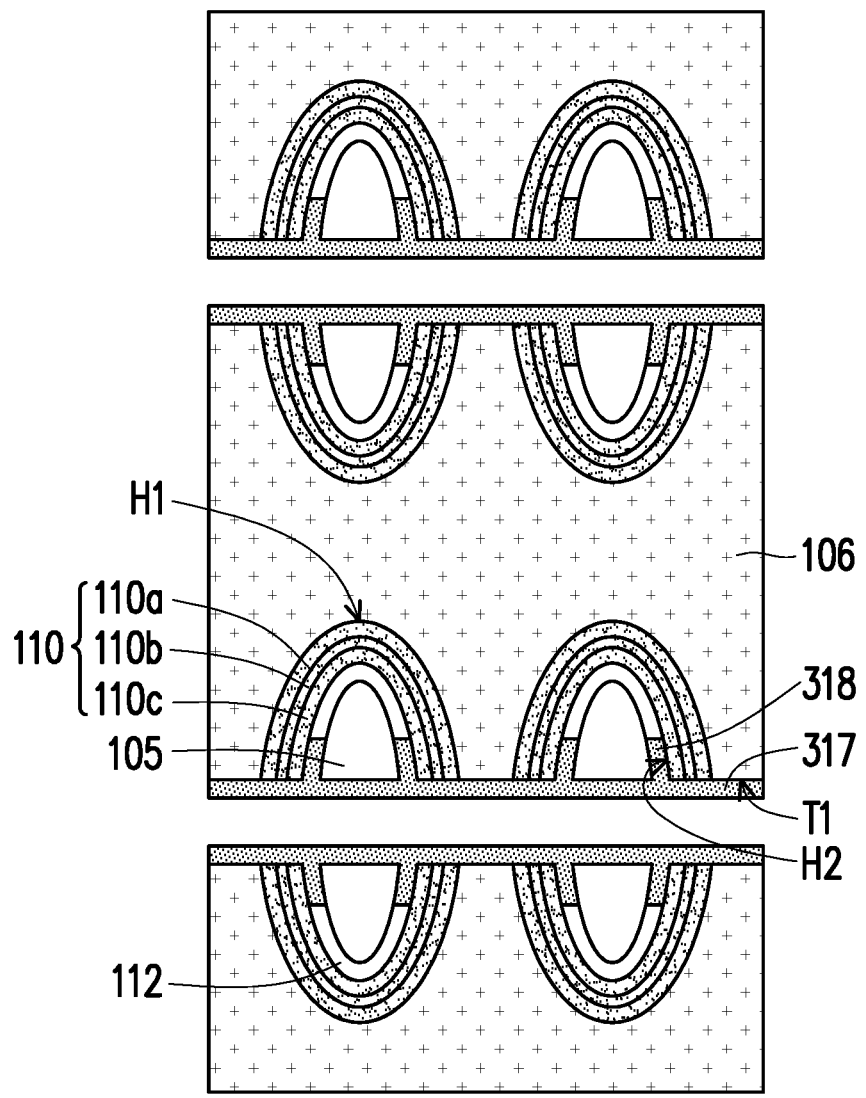

Referring to FIG. 3D, a source/drain material layer 317 is formed on the surfaces of the trenches T1, and the source/drain material layer 317 completely fills the openings H2. In an embodiment, the source/drain material layer 317 includes doped polysilicon.

Figure 3E:
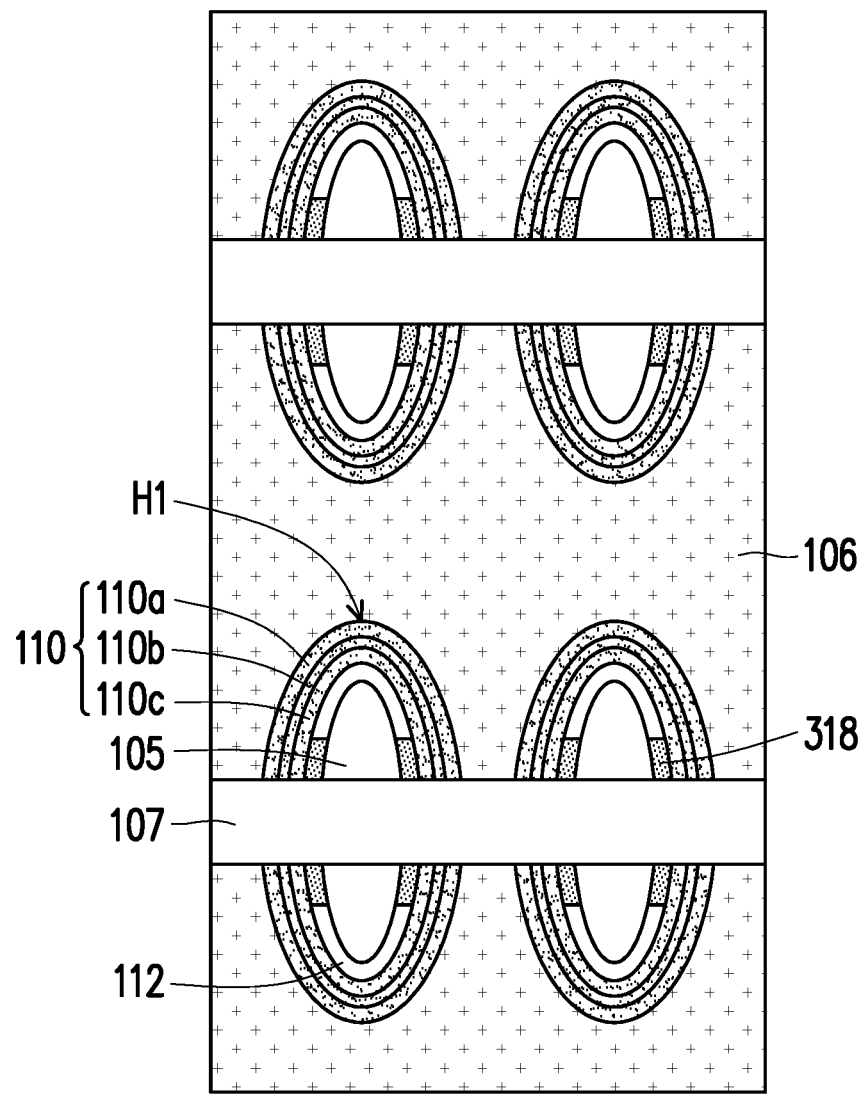

Referring to FIG. 3E, a portion of the source/drain material layer 317 is removed, so as to form a plurality of source/drain pillars 318. Specifically, the source/drain material layer 317 on the surfaces of the trenches T1 are removed, while the source/drain material layer 317 within the openings H2 serve as the source/drain pillars 318. In an embodiment, two source/drain pillars 318 are disposed at two ends of each of the channel pillars 112.

Thereafter, an isolation layer 107 is formed in the trenches T1. In an embodiment, the isolation layer 107 includes silicon oxide. In an embodiment, the top of the isolation layer 107 is substantially coplanar with the top of the stacked structure.

Figure 3F:
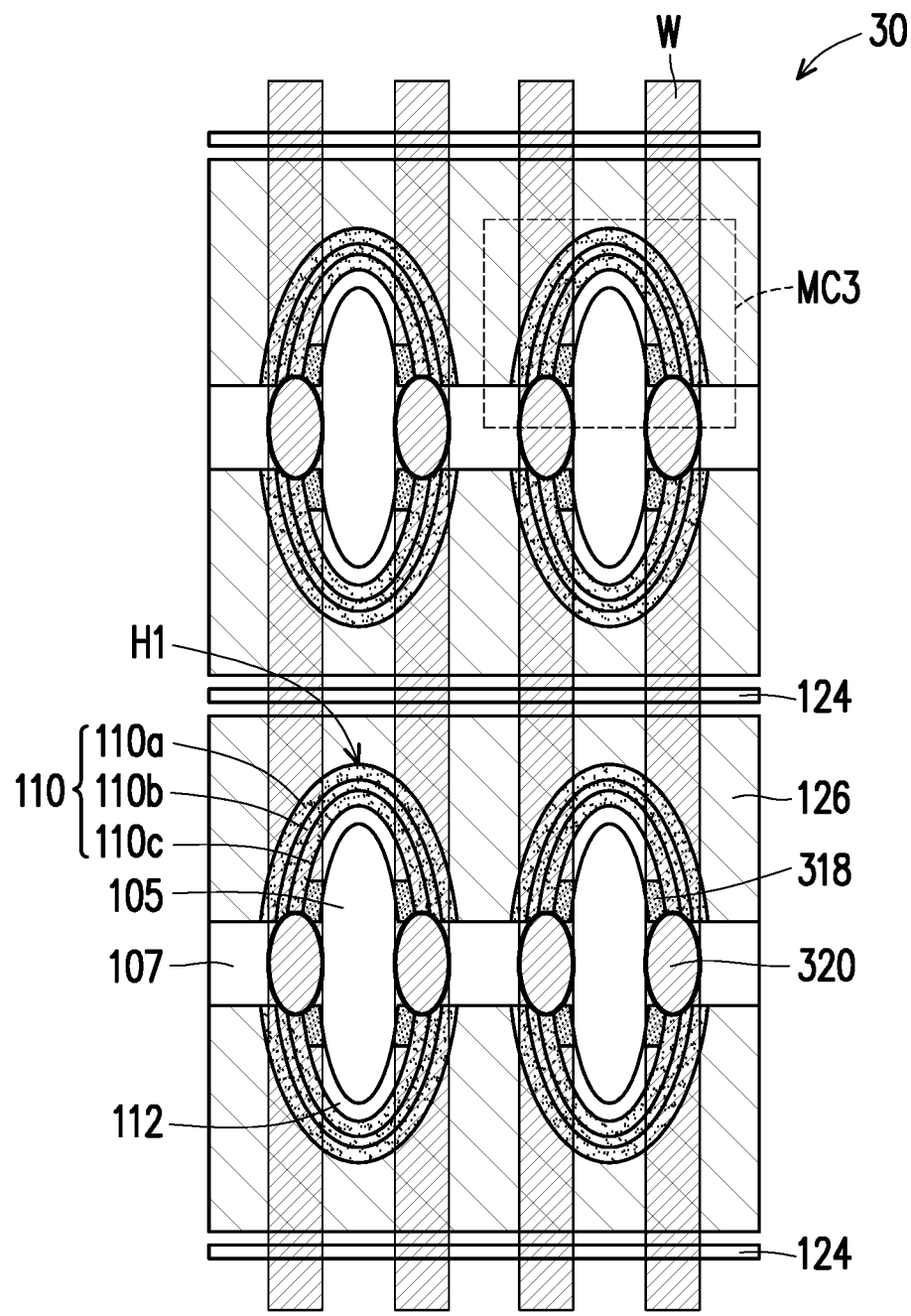

Referring to FIG. 3F, the second films 106 of the stacked structure are replaced with gate electrode layers 126. In an embodiment, the gate electrode layers 126 include tungsten (W), cobalt (Co), aluminum (Al), tungsten silicide ($WSi_x$), or cobalt silicide ($CoSi_x$). Moreover, in another embodiment, a buffer layer and a barrier layer are formed between each gate electrode layer 126 and the corresponding charge storage structure 110. The buffer layer includes a material having a dielectric constant greater than 7, such as aluminium oxide ($Al_2O_3$), hafnium oxide ($HfO_2$), lanthanum oxide ($La_2O_5$), transition metal oxide, lanthanide oxide, or a combination thereof. The barrier layer includes titanium (Ti), titanium nitride (TiN), tantalum (Ta), tantalum nitride (TaN), or a combination thereof.

In an embodiment, this replacement step is performed when the second films 106 are sacrificial layers (e.g., silicon nitride layers). However, the present invention is not limited thereto. In another embodiment, this replacement step may be omitted when the second films 106 are gate electrode layers (e.g., doped polysilicon layers). Memory cells MC3 of the present invention are thus completed.

In an embodiment, each of the memory cells MC3 includes a gate electrode layer 126 laterally disposed, an arc-shaped channel pillar 112 vertically disposed, a charge storage structure 110 disposed between a gate electrode layer 126 and the arc-shaped channel pillar 112, and two source/drain pillars 318 disposed at two ends of the arc-shaped channel pillar 112. In the present embodiment, the source/drain pillars 318 at the corresponding ends of two adjacent arc-shaped channel pillars 112 are separated from each other. In the present embodiment, the face-to-face memory cells MC3 are in a mirror symmetrical configuration, and can be operated separately or together upon the design requirements. The memory cells MC3 of the present invention have arc-shaped channel pillars, so as to generate the curvature effect to enhance the operation window of programing/erasing the memory cells, and therefore provide a longer channel length and an improved device performance.

In an embodiment, the three-dimensional flash memory device of the present invention may optionally include conductive layers 124 as heaters, so as to heat the gate stacked structure, as shown in FIG. 3F. In an embodiment, the conductive layers 124 are simultaneously formed in the above replacement step. The conductive layers 124 are disposed on the substrate adjacent to the sidewalls of the gate stacked structure and extend along the sidewalls of the gate stacked structure.

Still referring to FIG. 3F, multiple conductive wires W are formed on the stacked structure and electrically connected to the memory cells MC3. Specifically, the conductive wires W are electrically connected to the memory cells MC3 of the (N)-th row and the (N+1)-th row, wherein N is an integer. In an embodiment, each of the conductive wires W is a source line or a bit line upon the design requirements. In an embodiment, the conductive wires W are electrically connected to the memory cells MC3 through contact plugs 320, respectively. Specifically, a contact plug 320 is electrically connected to the source/drain pillars 318 at the corresponding ends of two adjacent arc-shaped channel pillars 112. In an embodiment, from a top view, the contact plug 320 is partially overlapped with the adjacent source/drain pillars 318. The three-dimensional flash memory device 30 of the present invention is thus completed.

Moreover, the three-dimensional flash memory devices of the present invention may be further modified according to the three structures described above. Several structures are listed below, but are not intended to limit the present invention. Specifically, the memory cell are contemplated as falling within the spirit and scope of the present invention, as long as the memory cells have arc-shaped channel pillars so as to generate the curvature effect to provide a longer channel length and an improved device performance.

Figure 4:
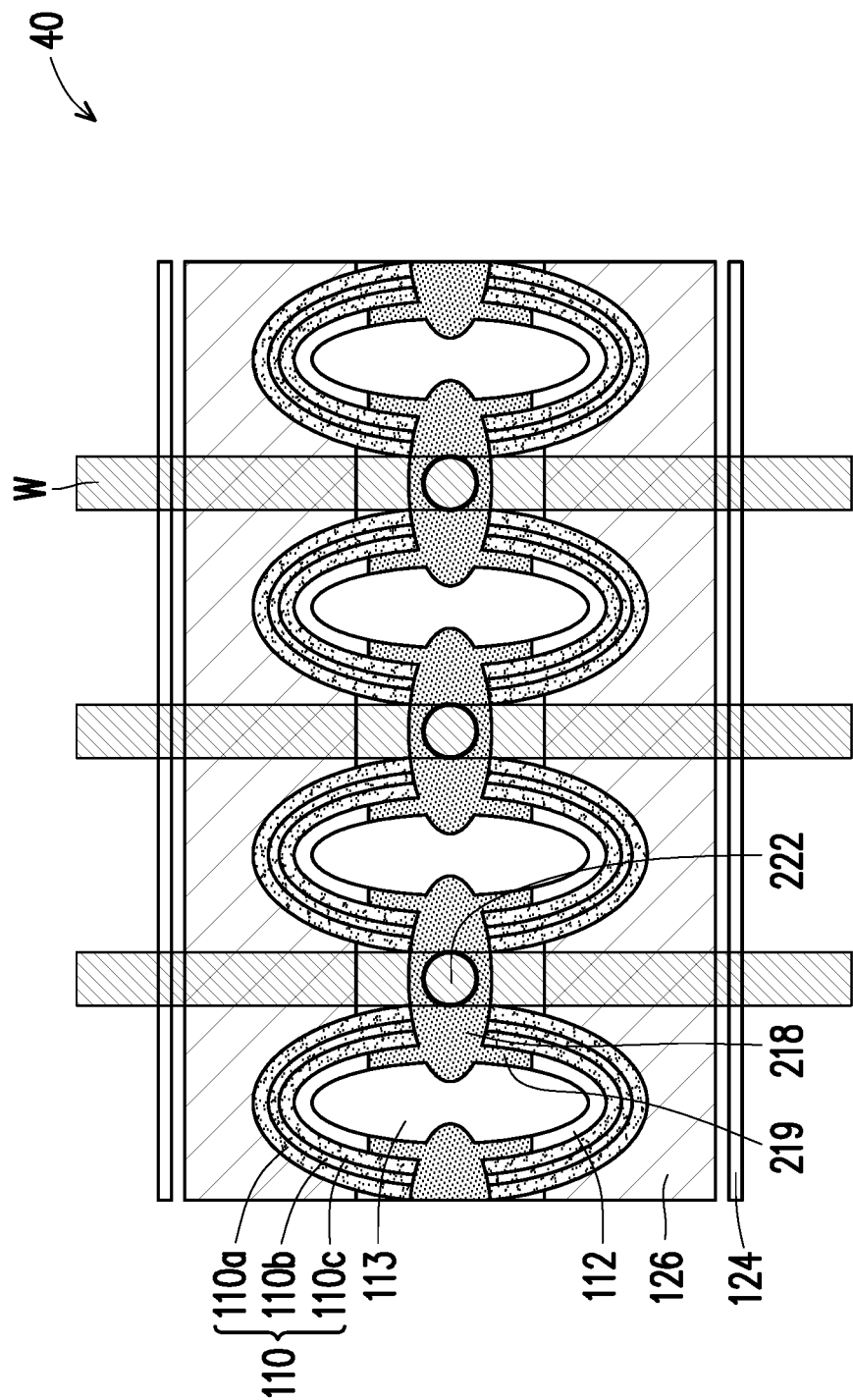
FIG. 4 is a schematic top view of a three-dimensional flash memory according to a fourth embodiment of the present invention.

FIG. 4 is a schematic top view of a three-dimensional flash memory according to a fourth embodiment of the present invention. The three-dimensional flash memory device 40 of FIG. 4 is similar to the three-dimensional flash memory device 20 of FIG. 2, so the difference between them is described below, and the similarity is not iterated herein. In the three-dimensional flash memory device 20 of FIG. 2, the source/drain pillars 218 at the ends the neighboring arc-shaped channel pillars of the same row are separated from each other. However, in the three-dimensional flash memory device 40 of FIG. 4, the source/drain pillars 218 at the ends the neighboring arc-shaped channel pillars of the same row are connected to each other. Since the neighboring memory cells of the same row share the connected source/drain pillars 218, such larger-area source/drain pillars 218 are beneficial to reduce the resistance value and provide a larger landing area for the subsequently formed contact plug. Such design allows more pitch scaling.

FIG. 5 is a schematic top view of a three-dimensional flash memory according to a fifth embodiment of the present invention. The three-dimensional flash memory device 50 of FIG. 5 is similar to the three-dimensional flash memory device 20 of FIG. 2, so the difference between them is described below, and the similarity is not iterated herein. In the three-dimensional flash memory device 20 of FIG. 2, the source/drain pillars 218 at the ends of the arc-shaped channel pillars of the same row are aligned with each other. However, in the three-dimensional flash memory device 50 of FIG. 5, the source/drain pillars 218 at the ends of the arc-shaped channel pillars of the same row are staggered to one another. The source/drain pillars 218 in such staggered arrangement can provide more process window for the overlying contact plugs 222. Besides, such asymmetrical or twisted source/drain pillars 218 are beneficial to reduce the gate induce drain leakage (GIDL).

FIG. 6 is a schematic top view of a three-dimensional flash memory according to a sixth embodiment of the present invention. The three-dimensional flash memory device 60 of FIG. 6 is similar to the three-dimensional flash memory device 50 of FIG. 5, so the difference between them is described below, and the similarity is not iterated herein. In the three-dimensional flash memory device 50 of FIG. 5, the extension direction of the gate electrode layers 126 is substantially perpendicular to the extension direction of the overlying conductive wires W. Specifically, as shown in FIG. 5, an included angle between the extension direction of the gate electrode layers 126 and the extension direction of the overlying conductive wires W is about 90 degrees. However, in the three-dimensional flash memory device 60 of FIG. 6, the extension direction of the gate electrode layers 126 is not perpendicular to the extension direction of the overlying conductive wires W. Specifically, as shown in FIG. 6, an included angle between the extension direction of the gate electrode layers 126 and the extension direction of the overlying conductive wires W is less than 90 degrees. The source/drain pillars 218 in such staggered arrangement can provide more process window for the overlying contact plugs 222 and help to reduce the gate induce drain leakage (GIDL). Furthermore, such tilted layout can provide more process flexibility.

Figure 7B:
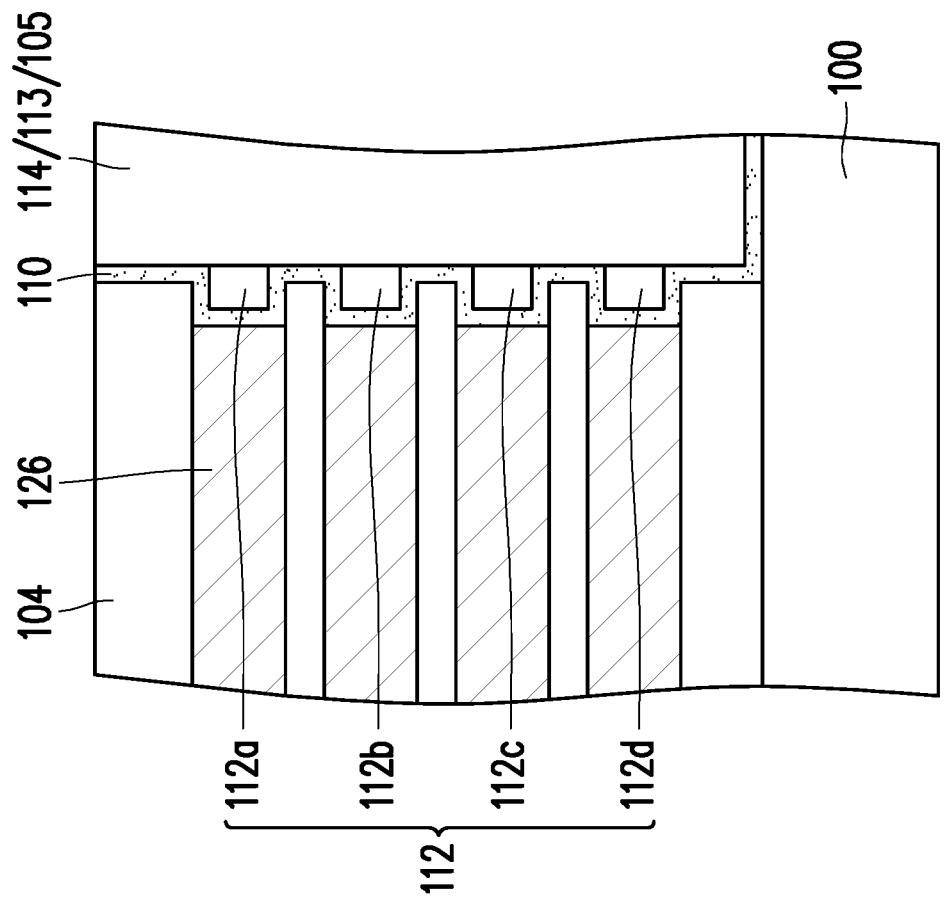
FIG. 7B is a schematic cross-sectional view of part of a three-dimensional flash memory according to another embodiment of the present invention.
Figure 7A:
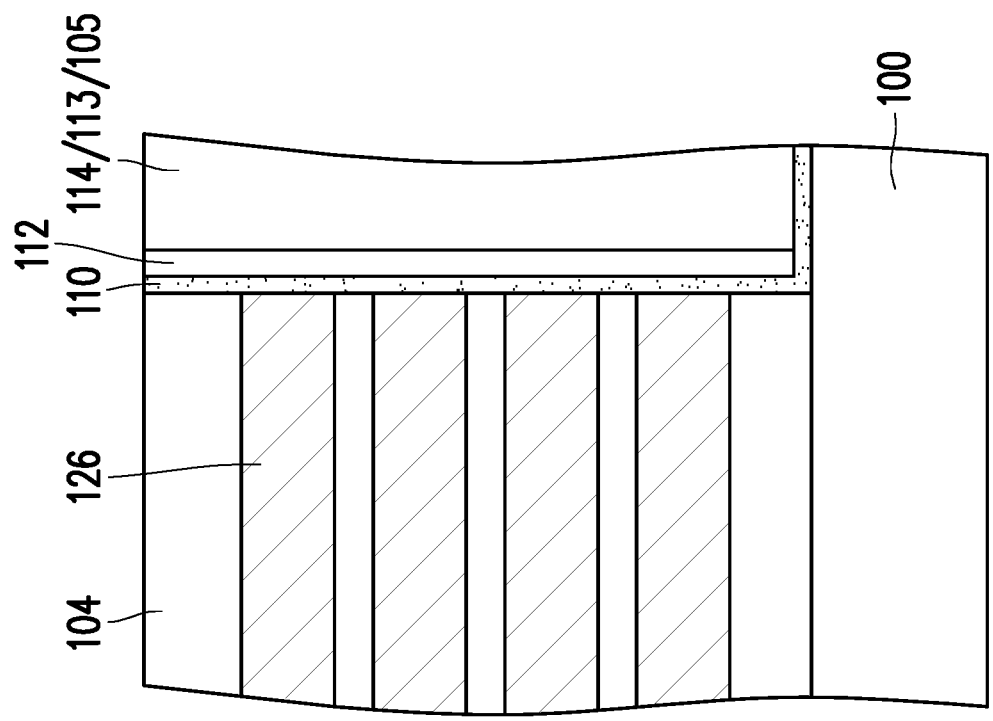
FIG. 7A is a schematic cross-sectional view of part of a three-dimensional flash memory according to an embodiment of the present invention.

FIG. 7A is a schematic cross-sectional view of part of a three-dimensional flash memory according to an embodiment of the present invention. FIG. 7B is a schematic cross-sectional view of part of a three-dimensional flash memory according to another embodiment of the present invention. The cross-sectional views of FIG. 7A and FIG. 7B can be applied to any one of the three-dimensional flash memory device 10/20/30/40/50/60 of the present invention.

Referring to FIG. 7A, the gate stacked structure has a substantially vertical sidewall and includes a plurality of first films 104 (e.g., insulating layers) and a plurality of gate electrode layers 126 arranged alternately, in which the ends of the first films 104 are substantially aligned with the ends of the gate electrode layers 126. The charge storage structure 110 is continuous in an extension direction thereof, and the sidewall of charge storage structure 110 has a substantially vertical profile. Moreover, the channel pillar 112 is continuous in an extension direction thereof, and the sidewall of the channel pillar 112 has a substantially vertical profile.

Referring to FIG. 7B, the gate stacked structure has a wavy sidewall and includes a plurality of first films 104 (e.g., insulating layers) and a plurality of gate electrode layers 126 arranged alternately, in which the ends of the first films 104 are protruded from the ends of the gate electrode layers 126. The charge storage structure 110 is continuous in an extension direction thereof, and the sidewall of the charge storage structure 110 has a wavy profile. Moreover, the channel pillar 112 is discontinuous in an extension direction thereof, and the channel portions of the channel pillar merely correspond to the gate electrode layers 126. Specifically, the channel pillar 112 is not integral in the extension direction thereof and is divided into a plurality of disconnected portions. In other words, the formed channel pillar 112 includes a plurality of channel portions 112a, 112b, 112c and 112d, and one channel portion is disposed between the two adjacent first films 104 and corresponds to one of the gate electrode layers 126 of the stacked structure. That is to say, the channel portions 112a, 112b, 112c and 112d are sequentially disposed along the extension direction of the channel pillar 120 and are not in physical contact with each other. Such configuration limits charge storage structure 110 and the channel pillar 112 on the sidewall of the corresponding gate electrode layers 126, which can significantly reduce the leakage current and provide better gate control and programming efficiency.

The structures of the three-dimensional flash memory devices of the present invention are illustrated below with reference to FIG. 1A to FIG. 7B.

The three-dimensional flash memory device 10/20/30/40/50/60 of the present invention includes a gate stacked structure, a plurality of separate arc-shaped channel pillars 112, a plurality of source/drain pillars 118/218/318 and a charge storage structure 110. The gate stacked structure is disposed on the substrate 100 and includes a plurality of gate electrode layers 126 insulated from each other. The separate arc-shaped channel pillars 112 are disposed on the substrate 100 and penetrate through the gate stacked structure. The source/drain pillars 118/218/318 are disposed on the substrate 100 and penetrate through the gate stacked structure. Besides, two source/drain pillars 118/218/318 are disposed at two ends of each of the arc-shaped channel pillars 112. The charge storage structure 110 is disposed between each of the gate layers 126 and the corresponding arc-shaped channel pillar 112.

In the three-dimensional flash memory device 10/20/30/40 of the present invention, two adjacent arc-shaped channel pillars 112 are in a mirror symmetrical configuration.

In the three-dimensional flash memory device 50/60 of the present invention, two adjacent arc-shaped channel pillars 112 are in a non-mirror symmetrical configuration.

In the three-dimensional flash memory device 10/20/30/40/50/60 of the present invention, an insulating pillar 114/113/105 is disposed between two adjacent arc-shaped channel pillars 112.

In the three-dimensional flash memory device 10 of the present invention, the insulating pillars 114 of different rows are in a staggered arrangement. In the three-dimensional flash memory device 20/30 of the present invention, the insulating pillars 113/105 of different rows are in an aligned arrangement. However, the present invention is not limited thereto. In the three-dimensional flash memory device 10/20/30/40/50/60 of the present invention, the insulating pillars of different rows are in an aligned arrangement or in a staggered arrangement upon the layout requirements.

In the three-dimensional flash memory device 10/30 of the present invention, the source/drain pillars 118/318 at the corresponding ends of two adjacent arc-shaped channel pillars 112 are separated from each other. In the three-dimensional flash memory device 10/30 of the present invention, a contact plug 122/320 is electrically connected to the source/drain pillars 118/318 at the corresponding ends of the two adjacent arc-shaped channel pillars 112.

In the three-dimensional flash memory device 20/40/50/60 of the present invention, the source/drain pillars 218 at the corresponding ends of two adjacent arc-shaped channel pillars 112 are connected to each other. In three-dimensional flash memory device 20/40/50/60 of the present invention, a contact plug 222 is electrically connected to the connected source/drain pillars 218.

In the three-dimensional flash memory device 10/20/30/40/50/60 of the present invention, the contact plug 122/222/320 is electrically connected to a conductive wire W1/W2/W over the gate stacked structure.

In the three-dimensional flash memory device 10/20/30/40/50/60 of the present invention, the conductive wire W1/W2/W includes a source line or a bit line.

In the three-dimensional flash memory device 10/20/30/40/50/60 of the present invention, each of the charge storage structures 110 has a substantially smooth profile (see FIG. 7A).

In three-dimensional flash memory device 10/20/30/40/50/60 of the present invention, each of the charge storage structures 110 has a wavy profile (see FIG. 7B).

In three-dimensional flash memory device 10/20/30/40/50/60 of the present invention, each of the arc-shaped channel pillars 112 is continuous in an extension direction thereof (see FIG. 7A).

In the three-dimensional flash memory device 10/20/30/40/50/60 of the present invention, each of the arc-shaped channel pillars 112 is discontinuous in an extension direction thereof, and channel portions of the arc-shaped channel pillar 112 merely correspond to the gate electrode layers 126 (see FIG. 7B).

In the three-dimensional flash memory device 10/20/30/40 of the present invention, distances from two ends of each of the plurality of arc-shaped channel pillars 112 to the corresponding gate electrode layer 126 are constant.

In the three-dimensional flash memory device 50/60 of the present invention, distances from two ends of each of the plurality of arc-shaped channel pillars 112 to the corresponding gate electrode layer 126 are non-constant.

In three-dimensional flash memory device 10/20/30/40/50/60 of the present invention, the arc-shaped channel pillars 112 include undoped polysilicon, and the source/drain pillars include doped polysilicon.

In the three-dimensional flash memory device 10 of the present invention, from a top view, each of the source/drain pillars 118 has an L-shape. In the three-dimensional flash memory device 20/50/60 of the present invention, from a top view, each of the source/drain pillars 218 has a combination of circular/annular shape and an arc shape. In the three-dimensional flash memory device 30 of the present invention, from a top view, each of the source/drain pillars 318 has an arc shape. The above embodiments in which the source/drain pillars of specific shapes are provided for illustration purposes, and are not construed as limiting the present invention. In another embodiment, the source/drain pillars may have another shape, such as an I-shape, an irregular shape, a polygonal shape or a combination thereof.

In summary, in the three-dimensional flash memory device of the present invention, the memory cells have arc-shaped channel pillars, so as to generate the curvature effect to enhance the operation window of programing/erasing the memory cells, and therefore provide a longer channel length and an improved device performance. Moreover, the three-dimensional flash memory device of the present invention may have high integration and high area utilization, and meets the requirement of fast operation speed.

Although the invention has been described with reference to the above embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:

1. A three-dimensional flash memory device, comprising:
   a gate stacked structure, disposed on a substrate and comprising a plurality of gate electrode layers insulated from each other;
   a plurality of separate arc-shaped channel pillars, disposed on the substrate and located in the gate stacked structure;
   a plurality of source/drain pillars, disposed on the substrate and penetrating through the gate stacked structure, wherein each of the plurality of arc-shaped channel pillars has two source/drain pillars disposed at two ends thereof; and
   a charge storage structure, disposed between each of the plurality of gate electrode layers and the corresponding arc-shaped channel pillar,
   wherein each arc-shaped channel pillar comprises two end surfaces separate from each other, and two source/drain pillars are correspondingly connected to the end surfaces of each of the arc-shaped channel pillars.

2. The three-dimensional flash memory device of claim 1, wherein two adjacent arc-shaped channel pillars are in a mirror symmetrical configuration.

3. The three-dimensional flash memory device of claim 1, wherein two adjacent arc-shaped channel pillars are in a non-mirror symmetrical configuration.

4. The three-dimensional flash memory device of claim 1, wherein an insulating pillar is disposed between two adjacent arc-shaped channel pillars.

5. The three-dimensional flash memory device of claim 4, wherein two adjacent insulating pillars are aligned in a row direction perpendicular to a direction that two adjacent channel pillars of the plurality of separate arc-shaped channel pillars are face-to-face, and the insulating pillars of different rows are in a staggered arrangement.

6. The three-dimensional flash memory device of claim 4, wherein two adjacent insulating pillars are aligned in a row direction perpendicular to a direction that two adjacent channel pillars of the plurality of separate arc-shaped channel pillars are face-to-face, and the insulating pillar of different rows are in an aligned arrangement.

7. The three-dimensional flash memory device of claim 1, wherein the source/drain pillars at the corresponding ends of two adjacent arc-shaped channel pillars are separated from each other.

8. The three-dimensional flash memory device of claim 7, wherein a contact plug is electrically connected to the source/drain pillars at the corresponding ends of the two adjacent arc-shaped channel pillars.

9. The three-dimensional flash memory device of claim 8, wherein the contact plug is electrically connected to a conductive wire over the gate stacked structure.

10. The three-dimensional flash memory device of claim 9, wherein the conductive wire comprises a source line or a bit line.

11. The three-dimensional flash memory device of claim 1, wherein the source/drain pillars at the corresponding ends of two adjacent arc-shaped channel pillars in a mirror symmetrical configuration are connected to each other.

12. The three-dimensional flash memory device of claim 11, wherein a contact plug is electrically connected to the connected source/drain pillars.

13. The three-dimensional flash memory device of claim 1, wherein a sidewall of each of the charge storage structures has a substantially smooth profile.

14. The three-dimensional flash memory device of claim 1, wherein a sidewall of each of the charge storage structures has a wavy profile.

15. The three-dimensional flash memory device of claim 1, wherein each of the plurality of arc-shaped channel pillars is continuous in an extension direction thereof.

16. The three-dimensional flash memory device of claim 1, wherein each of the plurality of arc-shaped channel pillars is discontinuous in an extension direction thereof, and channel portions of the arc-shaped channel pillar merely correspond to the gate electrode layers.

17. The three-dimensional flash memory device of claim 1, wherein distances from two ends of each of the plurality of arc-shaped channel pillars to the corresponding gate electrode layer are constant.

18. The three-dimensional flash memory device of claim 1, wherein distances from two ends of each of the plurality of arc-shaped channel pillars to the corresponding gate electrode layer are non-constant.

19. The three-dimensional flash memory device of claim 1, wherein the plurality of arc-shaped channel pillars comprises undoped polysilicon, and the plurality of source/drain pillars comprises doped polysilicon.

20. The three-dimensional flash memory device of claim 1, wherein from a top view, each of the plurality of source/drain pillars is an L-shape, an I-shape, an irregular shape, a polygonal shape, an arc shape, an annular shape or a combination thereof.

* * * * *